(12) United States Patent
Dong et al.

(10) Patent No.: US 11,977,109 B2
(45) Date of Patent: May 7, 2024

(54) SYSTEMS, METHODS AND TOOLS FOR THE INTERROGATION OF COMPOSITE STRENGTH MEMBERS

(71) Applicant: CTC GLOBAL CORPORATION, Irvine, CA (US)

(72) Inventors: Xiaoyuan Dong, Johns Creek, GA (US); William Webb, Laguna Niguel, CA (US); Christopher Wong, Santa Ana, CA (US); Ian Pilling, Rancho Santa Margarita, CA (US)

(73) Assignee: CTC Global Corporation, Irvine, CA (US)

( * ) Notice: Subject to any disclaimer, the term of this patent is extended or adjusted under 35 U.S.C. 154(b) by 810 days.

(21) Appl. No.: 16/963,118

(22) PCT Filed: Feb. 27, 2019

(86) PCT No.: PCT/US2019/019853
§ 371 (c)(1),
(2) Date: Jul. 17, 2020

(87) PCT Pub. No.: WO2019/168998
PCT Pub. Date: Sep. 6, 2019

(65) Prior Publication Data
US 2021/0048469 A1 Feb. 18, 2021

Related U.S. Application Data

(60) Provisional application No. 62/635,626, filed on Feb. 27, 2018, provisional application No. 62/786,271, (Continued)

(51) Int. Cl.
*G01R 31/08* (2020.01)
*B24D 13/14* (2006.01)
(Continued)

(52) U.S. Cl.
CPC ............ *G01R 31/085* (2013.01); *B24D 13/14* (2013.01); *H01B 3/08* (2013.01); *H01B 7/1805* (2013.01);
(Continued)

(58) Field of Classification Search
CPC .. G01R 31/085; B24D 13/14; G02B 6/02395; H01B 5/105; H01B 7/32; G01M 5/0058; G01M 11/086; G01M 11/30
See application file for complete search history.

(56) References Cited

U.S. PATENT DOCUMENTS

| | | | |
|---|---|---|---|
| 4,581,527 A | 4/1986 | Crane et al. | |
| 4,671,653 A | 6/1987 | So et al. | |

(Continued)

FOREIGN PATENT DOCUMENTS

| | | |
|---|---|---|
| CN | 101707077 A | 5/2010 |
| CN | 201667222 U | 12/2010 |

(Continued)

OTHER PUBLICATIONS

Office Action dated Oct. 11, 2022 for Australian Patent Application No. 2019229255.
(Continued)

*Primary Examiner* — David P Porta
*Assistant Examiner* — Meenakshi S Sahu
(74) *Attorney, Agent, or Firm* — David E. Dockery; The Navitas Intellectual Property Group LLC

(57) ABSTRACT

Systems, methods and tools for the interrogation of fiber-reinforced composite strength members to assess the structural integrity of the strength members. The systems and methods utilize the transmission of light through optical fibers that are embedded along the length of the strength members. The inability to detect light through one or more of the optical fibers may be an indication that the structural (Continued)

integrity of the A strength member is compromised. The systems and methods may be implemented without great difficulty and may be implemented at any time in the life cycle of the strength member, from production through installation. The systems and methods have particular applicability to bare overhead electrical cables that include a fiber-reinforced strength member.

22 Claims, 9 Drawing Sheets

Related U.S. Application Data filed on Dec. 28, 2018, provisional application No. 62/807,298, filed on Feb. 19, 2019.

(51) Int. Cl.
*G02B 6/02* (2006.01)
*H01B 3/08* (2006.01)
*H01B 7/18* (2006.01)
*H01B 9/00* (2006.01)

(52) U.S. Cl.
CPC ............. *H01B 9/005* (2013.01); *H01B 9/008* (2013.01); *G02B 6/02395* (2013.01)

(56) References Cited

U.S. PATENT DOCUMENTS

| | | | |
|---|---|---|---|
| 4,936,649 A | 6/1990 | Lymer et al. | |
| 5,771,250 A | 6/1998 | Shigehara et al. | |
| 6,588,942 B1 | 7/2003 | Weld et al. | |
| 7,368,162 B2 | 5/2008 | Hiel et al. | |
| 8,075,809 B2 | 12/2011 | Franke et al. | |
| 8,213,756 B2 | 7/2012 | Herbst | |
| 8,314,926 B2 | 11/2012 | Motter et al. | |
| 9,733,444 B2 | 8/2017 | LeBlanc | |
| 10,102,941 B2 | 10/2018 | Zhu et al. | |
| 2009/0230578 A1 | 9/2009 | Franke et al. | |
| 2011/0085158 A1 | 4/2011 | Motter et al. | |
| 2012/0090892 A1 | 4/2012 | Meyer et al. | |
| 2014/0049786 A1 | 2/2014 | Knuepfer et al. | |
| 2015/0323420 A1 | 11/2015 | Kuznia et al. | |
| 2016/0265339 A1* | 9/2016 | Xia | G02B 6/4411 |

FOREIGN PATENT DOCUMENTS

| | | | |
|---|---|---|---|
| CN | 203588738 U | 5/2014 | |
| CN | 106999030 A | 8/2017 | |
| CO | 5280161 A1 | 5/2003 | |
| CO | 6140079 A2 | 3/2010 | |
| CO | NC20160002651 | 10/2016 | |
| DE | 102008026781 A1 | 12/2009 | |
| EP | 0203249 A2 | 12/1986 | |
| EP | 1033597 A1 | 9/2000 | |
| EP | 3759454 A1 | 1/2021 | |
| JP | S59805 B2 | 1/1984 | |
| JP | S60229608 A | 11/1985 | |
| JP | H0634400 A | 2/1994 | |
| JP | H07226117 A | 8/1995 | |
| JP | H07320552 A | 12/1995 | |
| JP | H11038283 A | 2/1999 | |
| JP | 2001219345 A | 8/2001 | |
| JP | 2007299539 A | 11/2007 | |
| TW | 329474 B | 4/1998 | |
| WO | 2008102344 A1 | 8/2008 | |
| WO | 2015142608 A1 | 9/2015 | |
| WO | 2015152928 A1 | 10/2015 | |
| WO | 2015/195150 A1 | 12/2015 | |
| WO | 2019168998 A1 | 9/2019 | |

OTHER PUBLICATIONS

Office Action dated Jun. 28, 2022 for Japanese Patent Application No. 2020-544259.
Office Action dated Aug. 30, 2022 for Pakistani Patent Application No. 121/2019.
Office Action dated Aug. 31, 2022 for ARIPO Patent Application No. AP/P/2020/012162.
Office Action dated Dec. 23, 2022 for Chinese Patent Application No. 201980005094.2.
Office Action dated Dec. 8, 2021 for Eurasian Patent Application No. 202090210.
Office Action dated Jan. 17, 2023 for Japanese Patent Application No. 2020-544259.
Office Action dated Jul. 11, 2022 for Dominican Republic Patent Application No. P2020-0158.
Office Action dated Jul. 29, 2022 for Argentine Application No. 20190100489.
Office Action dated Jun. 28, 2022 for Chilean Patent Application No. 2159-2020.
Office Action dated Feb. 12, 2020 for Bangladesh Patent Application No. 49/2019.
Office Action dated Oct. 6, 2022 for Colombian Patent Application No. NC2020/0011628.
Office Action dated Sep. 26, 2022 for Saudi Arabian Application No. 520420048.
Office Action dated Sep. 28, 2022 for Indonesian Patent Application No. P00202005219.
Office Action Dated Sep. 30, 2021 for Chilean Patent Application No. 02159-2020.
Office Action for Egyptian Patent Application No. PCT 224/2020.
Partial Search Report dated Oct. 28, 2021 for European Patent Application No. 19760511.6.
Pre-grant Opposition dated May 31, 2022 for Indian Patent Application No. 202017020570.
Office Action dated Apr. 12, 2022 for Eurasian Patent Application No. 202090210.
Extended European Search Report dated Dec. 22, 2023 for European Application No. 23179560.0.
Office Action dated Aug. 31, 2023 for Australian Patent Application No. 2019229255.
Office Action dated Dec. 26, 2023 for Chinese Patent Application No. 201980005094.2.
Office Action dated Jul. 25, 2023 for Mexican Patent Application No. MX/a/2020/001496.
Office Action dated Jul. 6, 2023 for European Patent Application No. 19760511.6.
Office Action dated Jun. 16, 2023 for New Zealand Patent Application No. 766875.
Office Action dated Jun. 22, 2023 for Saudi Arabian Patent Application No. 520420048.
Office Action dated Jun. 6, 2023 for Eurasian Patent Application No. 202391219.
Office Action dated Jun. 8, 2023 for Argentine Patent Application No. 20190100489.
Office Action dated Mar. 31, 2023 for Israeli Patent Application No. 276939.
Office Action dated Mar. 7, 2023 for Taiwanese Patent Application No. 108106578.
Office Action Dated May 31, 2023 for Chinese Patent Application No. 201980005094.2.
Office Action dated Nov. 22, 2023 for Brazilian Patent Application No. BR112020017442-4.
Office Action dated Oct. 20, 2023 for Indonesian Patent Application No. P00202005219.
Office Action dated Sep. 18, 2023 for Korean Patent Application No. 10-2020-7005749.
Office Action and Search Report dated Jun. 7, 2022 for Taiwanese Patent Application No. 108106578.
Office Action dated Jun. 2, 2022 for Canadian Patent Application No. 3,070,077.
Office Action dated Mar. 22, 2022 for Chinese Patent Application No. 201980005094.2.

(56) References Cited

OTHER PUBLICATIONS

Office Action dated Apr. 5, 2022 for Indian Patent Application No. 202017020570.
Extended European Search Report dated Mar. 3, 2022 for European Patent Application No. 19760511.6.
Hofer et al., "Fibre optic damage detection in composite structures", Composites, IPC Business Press Ltd. Haywards Heath, GB, vol. 18, No. 4, Sep. 1, 1987, pp. 309-316.
Malki et. al. "Impact and vibration detection in composite materials by using intermodal interference in multimode optical fibers," Appl. Opt. vol. 35, Issue 25, pp. 5198-5201 (Jan. 9, 1996).
International Search Report and Written Opinion of the International Searching Authority, PCT Application No. PCT/US2019/019853, dated May 30, 2019.
Office Action dated Aug. 12, 2021 for Eurasian Patent Application No. 202090210.
Office Action dated Nov. 16, 2021 for Canadian Patent Application No. 3,070,077.
Office Action dated Sep. 30, 2021 for Chilean Patent Application No. 202002159.
Search Report dated Sep. 2, 2021 for Panama Patent Application No. 93175-01.
Abhisek Ukil et al., Distributed Temperature Sensing: Review of Technology and Applications, IEEE Sensors Journal, Jul. 18, 2011, pp. 885-892, vol. 12, Issue 5, IEEE.
FLS-240 Pocket Pal Visual Fault Locator, Commercial Brochure, 2013, 2 pages.
K.S.C. Kuang et al., Detection of Impact Damage in Thermoplastic-Based Glass Fiber Composites Using Embedded Optical Fiber Sensors, Journal of Thermoplastic Composite Materials, May 2003, pp. 213-229, vol. 16.
Michel LeBlanc et al., Impact Damage Assessment in Composite Materials with Embedded Fibre-Optic Sensors, Composites Engineering, Pergamon Press Ltd., Feb. 1992, pp. 573-596, vol. 2, Issues 5-7.
Office Action dated Mar. 15, 2021 for Canadian Patent Application No. 3,070,077.
Office Action dated Sep. 11, 2020 for Eurasian Patent Application No. 202090210/31.
Third Party Observations dated Apr. 6, 2020 for International Patent Application No. PCT/US2019/019853.
Third Party Observations dated Jun. 19, 2020 for International Patent Application No. PCT/US2019/019853.
Office Action dated Feb. 27, 2024 for Mexican Patent Application No. MX/a/2020/001496.
Office Action dated Jan. 31, 2024 for New Zealand Patent Application No. 766875.

\* cited by examiner

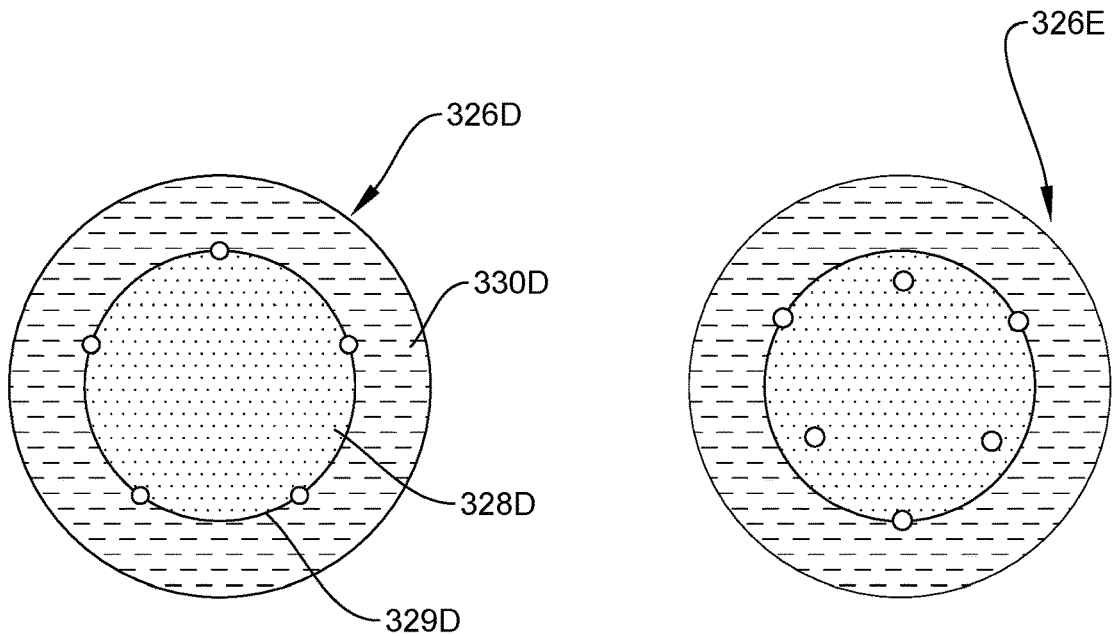
FIG. 3D
FIG. 3E
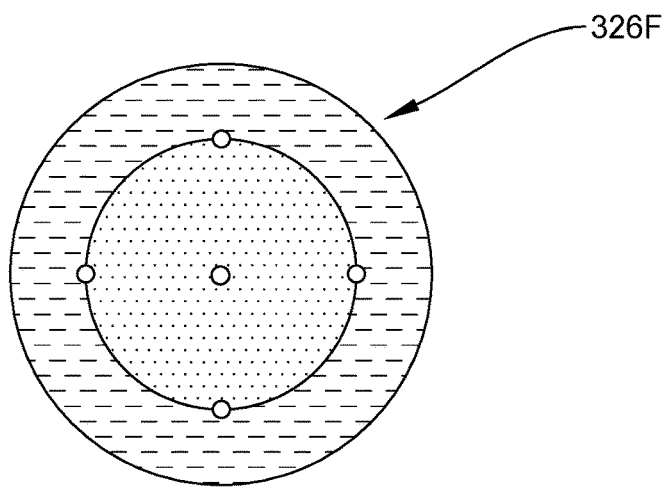
FIG. 3F

SYSTEMS, METHODS AND TOOLS FOR THE INTERROGATION OF COMPOSITE STRENGTH MEMBERS

FIELD

This disclosure relates to the field of fiber-reinforced composite strength members, and particularly to the field of structural integrity testing of such fiber-reinforced composite strength members.

BACKGROUND

Fiber-reinforced composite strength members are beneficial for use in a variety of structural applications due to their relatively high ratio of strength to weight and other desirable properties. For example, many elongated fiber-reinforced composite strength members are utilized as tensile members in structures such as bridges and railway messenger wires, replacing previously utilized materials such as steel.

One such application of fiber-reinforced composite strength members that has recently emerged is their use in bare overhead electrical cables for the transmission and distribution of electricity. Such electrical cables typically include a plurality of conductive metallic strands that are wrapped around and supported by a central strength member. Traditionally, the strength member was fabricated from steel. In recent years, fiber-reinforced composite materials have been utilized for the strength member. Such composite materials offer significant benefits as compared to steel, including lighter weight, smaller size (enabling the use of a greater cross-section of conductor), lower thermal sag and many other advantages. One example of an overhead electrical cable having such a fiber-reinforced strength member is the ACCC® bare overhead electrical cable available from CTC Global Corporation of Irvine, CA, USA. See, for example, U.S. Pat. No. 7,368,162 by Hiel et al, which is incorporated herein by reference in its entirety.

Unlike most metallic materials, fiber-reinforced composite materials typically have a low ductility. As a result, concern may arise that the fiber-reinforced composite strength member has been structurally compromised (e.g., fractured) during production, handling and/or installation of the strength member and/or the electrical cable. Small fractures in the strength member may be difficult detect by conventional methods. This is particularly true for overhead electrical cables due to the extreme length of the overhead electrical cable and due to the fact that the strength member is not visible after the conductive strands have been wrapped around the strength member.

Methods and systems for monitoring the conditions of a fiber-reinforced strength member during use of the strength member have been suggested. For example, it has been suggested that the temperature and strain on a strength member in an overhead electrical cable can be monitored during use using complex techniques such as optical time domain reflectometry (OTDR). However, such systems and methods require complex equipment, require the use of a coherent light source (e.g., a laser) and require precise alignment of the coherent light source with optical fibers attached to the strength member; all are difficult to implement in the field, e.g., in the outdoor environment through which electrical transmission and distribution lines are constructed.

SUMMARY

Disclosed herein are systems, methods, components and tools that enable the interrogation of fiber-reinforced composite strength members to ascertain if the composite strength members are structurally intact, e.g., to detect the presence of defects such as fractures in the strength member. The systems, methods, components and tools enable the relatively simple and low-cost interrogation of the strength members, in the manufacturing process, during installation, and/or after installation of the strength members.

The systems, methods, components and tools disclosed herein include, but are not limited to:

(i) a system for the detection of a defect in a fiber-reinforced composite strength member;
(ii) a method for the detection of a defect in a fiber-reinforced composite strength member;
(iii) a method for the preparation of a fiber-reinforced composite strength element for interrogation using a light source;
(iv) an elongate fiber-reinforced composite strength member including an optical fiber;
(v) a device for the transmission of light into an end of an optical fiber that is embedded in an elongate structural member;
(vi) a device for the detection of light emanating from an end of an optical fiber that is embedded in an elongate structural member;
(vii) a tool for cutting and polishing; and
(viii) a method for the manufacture of an elongate fiber-reinforced composite strength element that is configured for use in a tensile strength member.

Thus, in one embodiment, a system configured for the detection of a defect in a fiber-reinforced composite strength member is disclosed. The system includes a fiber-reinforced composite strength member, the strength member comprising at least a first strength element. The first strength element comprises a binding matrix, a plurality of reinforcing fibers operatively disposed within the binding matrix to form a fiber-reinforced composite, and at least a first optical fiber embedded within the fiber-reinforced composite and extending from a first end of the fiber-reinforced composite to a second end of the fiber-reinforced composite. A light transmitting device is operatively connected to a first end of the strength member, the light transmitting device comprising a light source that is configured to transmit light having a wavelength of at least about 300 nm and not greater than about 1700 nm through a first end of the first optical fiber. A light detecting device is operatively connected to a second end of the strength member, the light detecting device comprising a light detector that is configured to detect the light from the light transmitting device through a second end of the first optical fiber.

The foregoing system may be characterized as having feature refinements and/or additional features, which may be implemented alone or in any combination. In one characterization, the light source is configured to emit light having a primary wavelength in the infrared region. In one refinement, the light source is configured to emit light having a primary wavelength of at least about 800 nm. In another refinement, the light source is configured to emit light having a primary wavelength of not greater than about 1000 nm.

In another characterization, the strength element includes at least a second optical fiber embedded in the fiber-reinforced composite and extending along the length of the fiber-reinforced composite. In one refinement the strength element includes at least a third optical fiber embedded in the fiber-reinforced composite and extending along the length of the fiber-reinforced composite. In another refinement the strength element includes at least a fourth optical fiber embedded in fiber-reinforced composite and extending along the length of the fiber-reinforced composite.

In another characterization, the electrical cable has a length of at least about 100 meters. In yet another characterization the electrical cable has a length of not greater than about 3500 meters. In one characterization, an electrical conductor is disposed around and supported by the strength member to form an electrical cable.

In another characterization the first optical fiber is a single mode optical fiber. In another characterization the light source comprises a light-emitting diode (LED). In another characterization, the light detecting device comprises a concave lens that is disposed between the end of the composite strength member and the light sensor and is configured to focus the transmitted light onto the light sensor. In another refinement the light sensor is selected from a CCD sensor and a CMOS sensor.

In another embodiment, a method for the interrogation of a fiber-reinforced composite strength member is disclosed. The strength member comprises at least a first strength element, the strength element comprising a binding matrix and a plurality of reinforcing fibers operatively disposed within the binding matrix to form a fiber-reinforced composite. At least a first optical fiber is embedded in the fiber-reinforced composite and extends along a length of the fiber-reinforced composite. The method comprises the steps of operatively attaching a light transmitting device to a first end of the strength member, operatively attaching a light detecting device to a second end of the strength member, transmitting light from the light transmitting device through the first optical fiber and towards the light detecting device, where the transmitted light is incoherent, and detecting the presence of the incoherent transmitted light by the light detecting device.

The foregoing method may be characterized as having refinements and/or additional method steps, which may be implemented alone or in any combination. In one characterization, the transmitted light has a wavelength in the infrared region. In one refinement, the transmitted light has a primary wavelength of at least about 800 nm. In another refinement the transmitted light has a primary wavelength of not greater than about 1000 nm. In another characterization, the first strength element includes at least a second optical fiber embedded in the fiber-reinforced composite and extending along the length of the fiber-reinforced composite, and the step of transmitting the light transmits the light through the second optical fiber. In another refinement, the strength element includes at least a third optical fiber embedded in the fiber-reinforced composite and extending along the length of the fiber-reinforced composite, and the step of transmitting the light transmits the light through the third optical fiber. In another refinement, the strength element includes at least a fourth optical fiber embedded in the fiber-reinforced composite and extending along the length of the fiber-reinforced composite, and the step of transmitting the light transmits the light through the fourth optical fiber.

In another characterization, the composite strength member has a length of at least about 500 meters. In another refinement the composite strength member has a length of at least about 3500 meters. In another characterization, the composite strength member has a length of not greater than about 7500 meters. In another characterization, during the steps of transmitting the light and detecting the light, the composite strength member is wrapped onto a spool. In another characterization, the method comprises the step of stress testing the composite strength element before the steps of transmitting and detecting light.

In another characterization, an electrical conductor is stranded around the composite strength member to form an overhead electrical cable. In one refinement, the steps of transmitting and detecting the light are performed after stranding the composite strength member with the electrical conductor and before installation of the overhead electrical cable onto support towers. In another refinement, the steps of transmitting and detecting the light are performed after installation of the overhead electrical cable onto support towers.

In another characterization, the optical fiber is a single mode optical fiber. In another characterization, the step of transmitting light comprises energizing a light emitting diode (LED). In one refinement, the step of transmitting light comprises mechanically rotating the LED while transmitting the light. In another refinement, the LED is rotated at a speed of at least about 5 rpm.

In another characterization, an index-matching material is applied onto the first end of the strength member to facilitate the transmission of light into the optical fiber.

Another embodiment of the present disclosure is directed to a method for the preparation of a fiber-reinforced composite strength element for interrogation using a light source. The fiber-reinforced composite comprises a binding matrix and a plurality of reinforcing fibers disposed in the binding matrix, at least a first optical fiber is disposed in the fiber-reinforced composite, the first optical fiber extending from a first end of the fiber-reinforced composite to a second end of the fiber-reinforced composite. The method comprises the step of cutting an elongate fiber-reinforced composite proximate to a first end of the elongate fiber-reinforced composite, forming a first cut end surface that is substantially flat. The method also includes the step of polishing the first cut end surface to form a polished first end surface comprising the fiber-reinforced composite and a first end of the optical fiber. The resulting fiber-reinforced composite strength element is configured to be interrogated by an incoherent light source.

The foregoing method may be characterized as having refinements and/or additional steps, which may be implemented alone or in any combination. In one refinement, the method includes the step of cutting the fiber-reinforced composite proximate to the second end of the fiber-reinforced composite to form a second cut end surface that is substantially flat, and polishing the second cut end surface to form a polished second end surface comprising the fiber-reinforced composite and a second end of the first optical fiber.

In another characterization, the fiber-reinforced composite strength element has a length of at least about 100 meters. In yet another characterization the fiber-reinforced composite strength element has a length of not greater than about 7500 meters.

In another characterization, the step(s) of cutting the fiber-reinforced composite comprises cutting with a powered gritted cutting edge. In one refinement, the gritted cutting edge comprises abrasive grit having a grit size of at least about 30 µm. In another refinement, the gritted cutting edge is rotated by a motor during the cutting step. Another refinement includes the step of securing the first end of the fiber-reinforced composite during at least the cutting step such that the first end is disposed substantially orthogonally relative to the cutting edge during the cutting step. In another refinement, the polishing step comprises polishing the first cut end surface with a gritted polishing surface. In yet another refinement, the gritted polishing surface comprises abrasive grit having a grit size of not coarser than about 25

μm. In another refinement, the step of cooling the first end of the elongate fiber-reinforced composite material before and/or during the polishing step.

In another embodiment, an elongate fiber-reinforced composite strength member is disclosed. The strength member comprises at least a first fiber-reinforced composite strength element having a longitudinal central axis. The strength element comprises a binding matrix, a plurality of reinforcing fibers disposed within the binding matrix to form a fiber-reinforced composite, and at least a first elongate and continuous optical fiber embedded within the fiber-reinforced composite and extending from a first end of the strength element to a second end of the strength element. At least the first end of the strength element comprises a first end surface, the first end surface comprising the fiber-reinforced composite material and wherein the first optical fiber does not extend beyond the first end surface of the fiber-reinforced composite.

The foregoing strength member may be characterized as having feature refinements and/or additional features, which may be implemented alone or in any combination. In one characterization, the second end of the strength element comprises a second end surface, wherein the first optical fiber does not extend beyond the second end surface of the fiber-reinforced composite.

In another characterization, the strength element comprises at least a second elongate and continuous optical fiber embedded within the fiber-reinforced composite, and wherein the second optical fiber does not extend beyond the first end surface of the fiber-reinforced composite. In one refinement, the strength element comprises at least a third elongate and continuous optical fiber disposed within the fiber-reinforced composite, and wherein the third optical fiber does not extend beyond the first end surface of the fiber-reinforced composite. In another refinement, the strength element comprises at least a fourth elongate and continuous optical fiber disposed within the fiber-reinforced composite, and wherein the fourth optical fiber does not extend beyond the first end surface of the fiber-reinforced composite. In another refinement, the optical fibers are concentrically disposed around the longitudinal central axis of the strength element. In yet another refinement, the longitudinal central axis of the strength element is free of optical fibers.

In one characterization, the optical fiber(s) are single mode optical fibers. In another characterization, the optical fiber(s) are glass optical fibers. In one refinement, the glass optical fiber(s) comprise a transmissive glass core and a single polymeric coating surrounding the transmissive glass core. In another refinement, the single polymeric coating has a modulus of elasticity of at least about 1000 MPa.

In one characterization, the strength member has a length of at least about 100 meters. In one refinement, the strength member has a length of at least about 3500 meters. In another characterization, the strength member has a length of not greater than about 7500 meters. In another characterization, the strength member is wrapped onto a spool.

In another characterization, the strength member has a substantially circular cross-section. In one refinement, the strength member has a diameter of at least about 1.0 mm. In another refinement, the strength member has a diameter of not greater than about 20 mm. In another characterization, the reinforcing fibers comprise longitudinally extending carbon fibers. In one refinement, the strength member further comprises an insulating layer surrounding the carbon fibers. In another refinement, the insulating layer comprises glass fibers. In another refinement, the optical fibers(s) are disposed between the carbon fibers and the insulating layer.

In one characterization, the strength member has a rated tensile strength of at least about 1900 MPa. In another characterization, the strength member has a coefficient of thermal expansion of not greater than about $30 \times 10^{-6}/°$ C.

In another characterization, the first end surface of the fiber-reinforced composite is a polished surface. In one refinement, the second end surface of the fiber-reinforced composite is a polished surface. In yet another refinement, the first end surface is substantially orthogonal to the longitudinal central axis of the strength member. In another refinement, a first end of the first optical fiber is substantially co-planar with the first end surface of the fiber-reinforced composite.

In one characterization, the strength member comprises a single strength element. In another characterization, the strength member comprises a plurality of strength elements.

In another characterization, an overhead electrical cable is disclosed, wherein the overhead electrical cable comprises the strength member according to the foregoing embodiment, including any characterizations and refinements, and a conductive layer surrounding the strength member. In one refinement, the conductive layer comprises a plurality of conductive strands disposed around the strength member.

In another embodiment, a device for the transmission of light into an end of an optical fiber that is embedded in an elongate structural member is disclosed. The device comprises a substantially rigid structural body, a bore disposed at least partially through the structural body and having an aperture at a first end of the bore, the aperture and bore being configured to receive an end of an elongate structural member having at least a first optical fiber embedded along a length of the structural member. A light source is disposed at least partially within the structural body and proximate a second end of the bore, the light source being configured to transmit light into the bore and toward the end of the elongate member when the elongate member is placed in the first end of the bore. A power source operatively attached to the light source.

The foregoing device may be characterized as having feature refinements and/or additional features, which may be implemented alone or in any combination. In one characterization, the light source is an incoherent light source. In one refinement, the light source comprises a light emitting diode (LED). In another refinement, the LED is configured to emit light within a wavelength range of at least about 300 nm and not greater than about 1000 nm. In another refinement, the LED is configured to emit light within a wavelength range of at least about 800 nm and not greater than about 900 nm.

In another characterization, a motor is operatively connected to the light source and is configured to move the light source as the light source transmits light into the bore. In one refinement, the motor is configured to rotate the light source about a central axis of the light source.

In another characterization, a stop element is provided to maintain a distance between the light source and the end of the structural member when the structural member is placed into the first end of the bore. In one refinement, the stop element comprises a shoulder disposed within the bore, where the shoulder is configured to prevent movement of the structural member past the shoulder in a direction toward the light source. In one refinement, the stop element is configured to maintain a distance between the end of the structural member and the light source of at least about 0.1 mm and not greater than about 150 mm. In one characterization, the rigid structural body comprises a metal. In one refinement, the metal comprises aluminum.

Another embodiment according to the present disclosure is a device for the detection of light emanating from an end of an optical fiber that is embedded in an elongate structural member. The device includes a substantially rigid structural body, a bore disposed at least partially through the structural body and having an aperture at a first end of the bore. The aperture and bore are configured to receive an end of an elongate structural member having at least a first optical fiber embedded along a length of the structural member. A light detector disposed within the structural body and proximate a second end of the bore, the light detector being configured to receive and detect light from the optical fiber when the elongate member is placed in the first end of the bore. A power source is operatively attached to the light detector.

The foregoing device may be characterized as having feature refinements and/or additional features, which may be implemented alone or in any combination. In one characterization, the light detector is selected from a CCD sensor and a CMOS sensor. In another characterization, the device comprises a light blocking element disposed at the first end of the bore and configured to seal around the structural member when the structural member is placed into the bore. In one refinement, the light blocking element comprises an elastomeric material.

In another characterization, the device comprises a stop element configured to maintain a distance between the light detector and the end of the structural member when the structural member is placed into the first end of the bore. In one refinement, the stop element comprises a shoulder disposed within the bore that is configured to prevent movement of the structural member past the shoulder toward the light detector. In another refinement, the stop element is configured to maintain a distance between the end of the structural member and the light detector of at least about 5 mm and not greater than about 300 mm.

In another characterization, the device comprises a lens that is configured to focus light emanating from the optical fiber onto the light detector. In another characterization, the rigid structural body comprises a metal. In one refinement, the metal comprises aluminum.

In another embodiment, a tool for cutting and polishing is disclosed. The tool includes a planar body comprising a cutting edge disposed along at least one edge of the planar body, and a polishing surface covering at least a portion of the planar body. An alignment member is operatively associated with the planar body and is configured to operatively align an elongate structural member having a longitudinal axis with the planar body, such that the cutting edge of the planar body is configured to move and cut the elongate structural member substantially orthogonally to the longitudinal axis to form a cut surface. The polishing surface is configured to polish the cut surface as the cutting edge cuts and moves through the elongate structural member.

The foregoing tool for cutting and polishing may be characterized as having feature refinements and/or additional features, which may be implemented alone or in any combination. In one characterization, the planar body is substantially circular. In one refinement, a motor is operatively connected to the planar body and configured to rotate the planar body around a central axis of the planar body. In another refinement, the cutting edge comprises a plurality of cutting teeth. In yet another refinement, the cutting edge comprises a gritted surface. In yet another refinement, the gritted surface comprises abrasive grit having a size of at least about 35 μm. In another characterization, the polishing surface comprises abrasive polishing grit. In one refinement, the polishing grit has a size of not greater than about 25 μm. In another refinement, the polishing surface is raised above the surface of the planar body by at least about 0.1 mm and not greater than about 1.2 mm. In another characterization, an actuating mechanism is configured to push the polishing surface towards the end of the elongate structural member. In one refinement, the actuating mechanism comprises a spring.

In another characterization, a battery powers movement of the planar body. In one refinement, the battery has a voltage of not greater than about 18 volts. In another refinement, tool is a hand held tool comprising a gripping member for gripping and freely manipulating the tool. In one refinement, the tool comprises a capture mechanism configured for the capture of dust from cutting and polishing steps.

According to another embodiment, a method for the manufacture of an elongate fiber-reinforced composite strength element that is configured for use in a tensile strength member is disclosed. The method includes the steps of forming an elongate fiber-reinforced composite having a longitudinal central axis, the fiber-reinforced composite comprising a binding matrix and a plurality of reinforcing fibers disposed in the binding matrix. During the step of forming the fiber-reinforced composite, at least a first optical fiber is embedded into the fiber-reinforced composite, the first optical fiber extending from a first end of the fiber-reinforced composite to a second end of the fiber-reinforced composite. The fiber-reinforced composite is cut proximate to the first end of the fiber-reinforced composite, the cutting forming a first cut end surface that is substantially flat. The first cut end surface is then polished to form an elongate fiber-reinforced composite strength element having a polished first end surface, the polished first end surface comprising the fiber-reinforced composite and a first end of the optical fiber.

The foregoing method may be characterized as having refinements and/or additional steps, which may be implemented alone or in any combination. In one characterization, the method includes the steps of second cutting the fiber-reinforced composite proximate to the second end of the fiber-reinforced composite, the second cutting forming a second cut end surface that is substantially flat, and polishing the second cut end surface to form a second polished end surface comprising the fiber-reinforced composite and a second end of the first optical fiber.

In another characterization, the method comprises the steps of embedding, during the step of forming the fiber-reinforced composite, at least a second optical fiber into the fiber-reinforced composite, the second optical fiber extending from the first end of the fiber-reinforced composite to the second end of the fiber-reinforced composite. In another refinement, the method comprises the step of embedding at least a third optical fiber into the fiber-reinforced composite, the third optical fiber extending from the first end of the fiber-reinforced composite to the second end of the fiber-reinforced composite. In a further refinement, the method comprises the step of embedding at least a fourth optical fiber into the fiber-reinforced composite, the fourth optical fiber extending from the first end of the fiber-reinforced composite to the second end of the fiber-reinforced composite.

In another characterization, the optical fibers are concentrically disposed around a longitudinal central axis of the strength element. In another refinement, a longitudinal central axis of the strength element is free of optical fibers. In another characterization, the strength element has a length of at least about 3500 meters. In yet another characterization, the strength element has a length of not greater than about 7500 meters. In another characterization, the method further comprises the step of, before the cutting and polishing steps, wrapping the fiber-reinforced composite onto a spool. In another characterization, the reinforcing fibers comprise longitudinally extending carbon fibers. In another characterization, the step of forming the elongate fiber-reinforced composite and embedding the optical fibers comprises pulling the reinforcing fibers and the optical fiber(s) through a pultrusion apparatus. In another refinement, the step(s) of cutting the fiber-reinforced composite comprises cutting with a powered gritted cutting edge. In another characterization, the gritted cutting edge comprises abrasive grit having a size of at least about 30 µm. In another refinement, the powered gritted cutting edge is rotated by a motor during the cutting step.

In another characterization, the method comprises the step of securing the first end of the fiber-reinforced composite such that the first end is substantially orthogonally disposed relative to the cutting edge during the cutting step. In another refinement, the polishing step comprises polishing the first cut end surface with a polishing surface. In yet another refinement, the polishing surface comprises abrasive grit having a grit size of not larger than about 25 µm. In another characterization, the method comprises the step of cooling the first end of the fiber-reinforced composite before and/or during the polishing step.

DESCRIPTION OF THE DRAWINGS

FIGS. 3A to 3F illustrate cross-sectional views of composite strength elements including optical fibers according to embodiments of the present disclosure.

DESCRIPTION OF THE EMBODIMENTS

The present disclosure is directed to systems, methods, components and tools that enable the interrogation of a fiber-reinforced composite strength member to determine the structural integrity of the composite strength member.

As the terms are used in this disclosure, a fiber-reinforced composite strength member is a fiber-reinforced composite structure that is used in an application (e.g., a bare overhead electrical cable), such as for its lightweight and good mechanical properties (e.g., high tensile strength) as compared to, for example, steel. The fiber-reinforced composite includes reinforcing fibers in a binding matrix. A strength member may comprise a single (i.e., no more than one) strength element (e.g., a one-piece fiber-reinforced composite strength member), or may be comprised of several composite strength elements that are combined (e.g., twisted, stranded or otherwise bundled together) to form the strength member. As such, the present disclosure may use the terms strength member and strength element interchangeably, particularly where the strength member includes a single strength element.

The systems and methods for interrogation disclosed herein may incorporate a strength member that is uniquely configured for use in the systems and methods, and for use in similar systems and methods. In one embodiment, systems and methods for the interrogation of a fiber-reinforced composite strength member are disclosed where the composite strength member includes a fiber-reinforced composite strength element having at least a first optical fiber disposed within the strength element, a light transmitting device operatively connected to a first end of the strength element, and a light sensing device operatively connected to a second end of the strength element. The systems and methods are configured to interrogate the strength member to determine if the strength member is structurally compromised. The systems and methods are cost effective, and are relatively easy to implement at any point through the manufacture and installation of the strength member.

According to the present disclosure, the fiber-reinforced composite strength member may have one or more characteristics that enable the interrogation of the strength member in the interrogation system and method, although the characteristics of the fiber-reinforced composite strength member disclosed herein may also facilitate its use in other systems and in other methods.

Figure 1A:
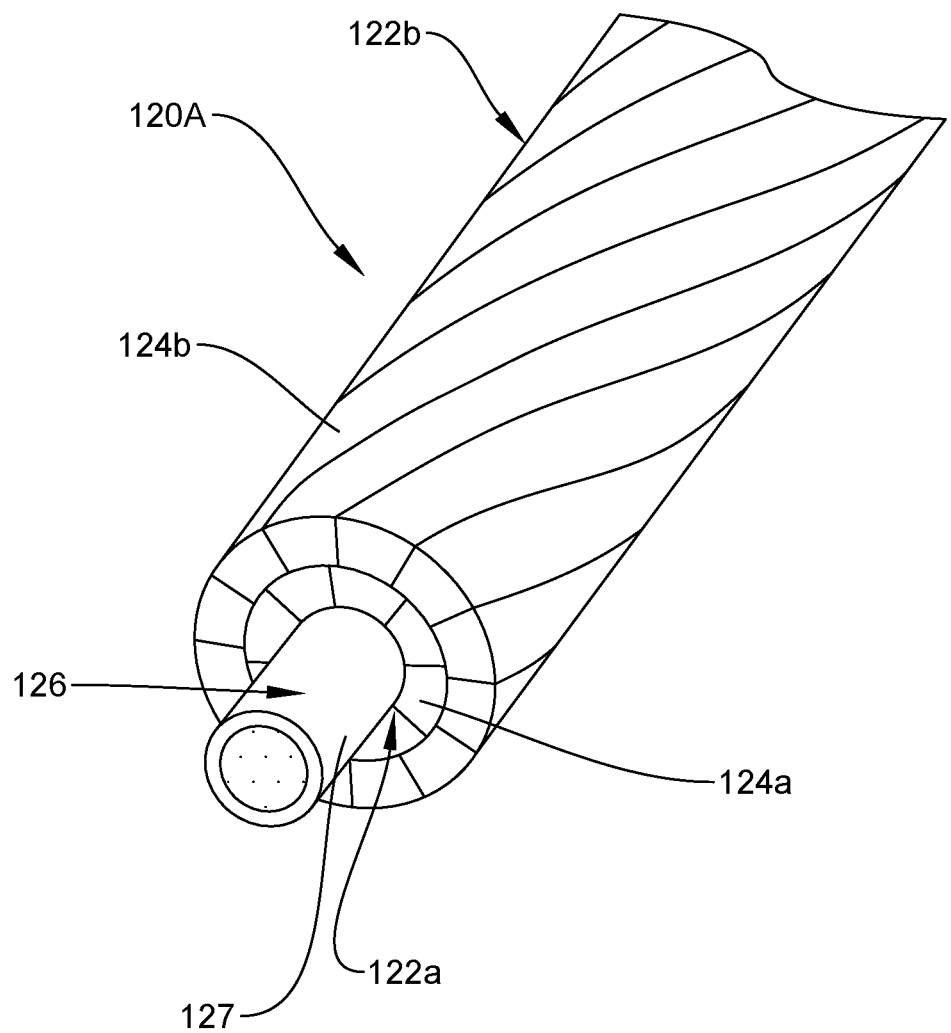
FIGS. 1A and 1B illustrate perspective views of bare overhead electrical cables.
Figure 1B:
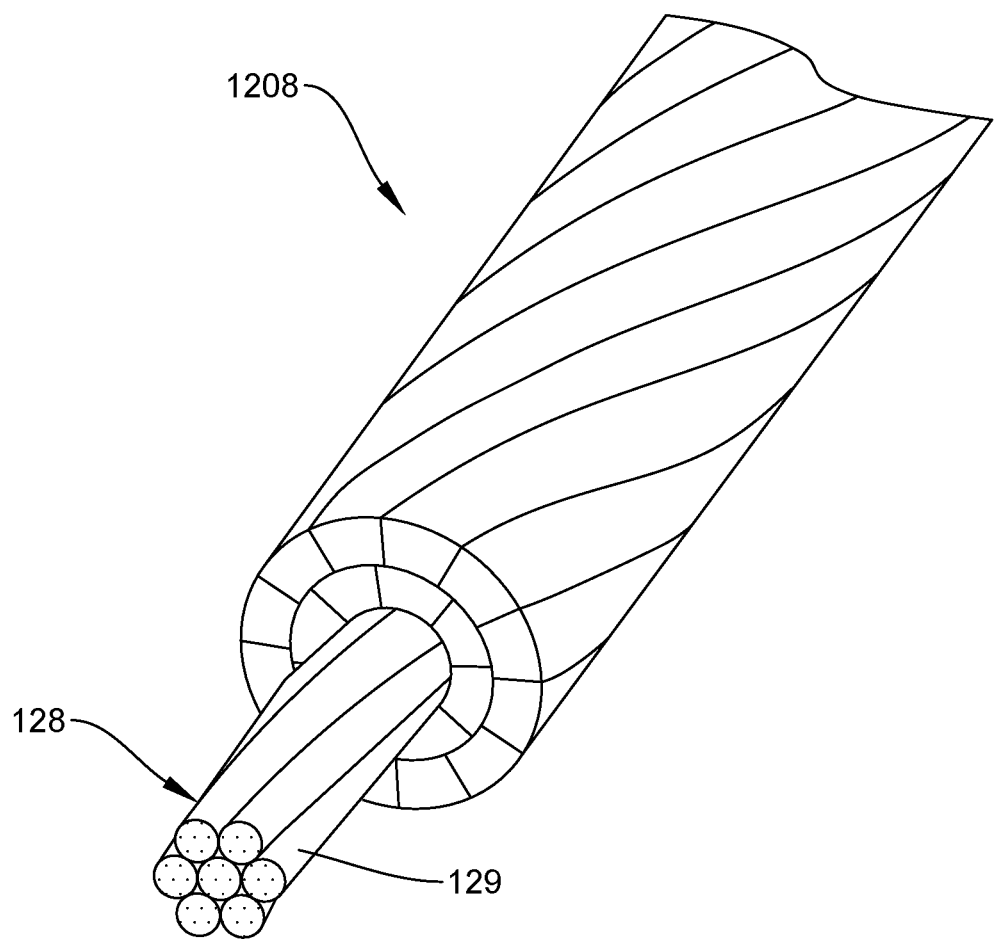

The strength members can be utilized in a variety of structural applications, particularly as a tensile strength member. In one particular embodiment, an elongate fiber-reinforced composite strength member is configured for use in an overhead electrical cable, e.g., a bare overhead electrical cable. As noted above, overhead electrical cables for the transmission and/or distribution of electricity typically include a central strength member and an electrical conductor disposed around and supported by the strength member. Although the strength member has traditionally been fabricated from steel, such steel strength members are increasingly being replaced by strength members fabricated from composite materials, particularly from fiber-reinforced composite materials, which offer many significant benefits. Such fiber-reinforced composite strength members may include of a single fiber-reinforced composite strength element (e.g., a single rod) as is illustrated in FIG. 1A. An example of such a configuration is disclosed in U.S. Pat. No. 7,368,162 by Hiel et al., noted above. Alternatively, the composite strength member may be comprised of a plurality of individual fiber-reinforced composite strength elements (e.g., individual rods) that are operatively combined (e.g., twisted or stranded together) to form the strength member, as is illustrated in FIG. 1B. Examples of such multi-element composite strength members include, but are not limited to: the multi-element aluminum matrix composite strength member illustrated in U.S. Pat. No. 6,245,425 by McCullough et al.; the multi-element carbon fiber strength member illustrated in U.S. Pat. No. 6,015,953 by Tosaka et al.; and the multi-element strength member illustrated in U.S. Pat. No. 9,685,257 by Daniel et al. Each of these U.S. patents is incorporated herein by reference in its entirety. Other configurations for the fiber-reinforced composite strength member may be used.

Referring back to the embodiment of FIG. 1A, the overhead electrical cable 120A includes a first conductive layer 122a comprising a plurality of conductive strands 124a that are helically wrapped around a fiber-reinforced composite strength member 126, which comprises a single fiber-reinforced composite strength element 127. The conductive strands 124a may be fabricated from conductive metals such as copper or aluminum, and for use in bare overhead electrical cables are typically are fabricated from aluminum, e.g., hardened aluminum, annealed aluminum, and/or aluminum alloys. The conductive materials, e.g., aluminum, and do not have sufficient mechanical properties (e.g., sufficient tensile strength) to be self-supporting when strung between support towers to form an overhead electrical line for transmission and/or distribution of electricity. Therefore, the overhead electrical cable 120A includes the strength member 126 to support the conductive layers 124a/124b when the overhead electrical cable 120A is strung between the support towers under high mechanical tension.

As illustrated in FIG. 1A, the conductive strands 124a/124b have a substantially trapezoidal cross-section, although other configurations may be employed, such as circular cross-sections. The use of polygonal cross-sections such as the trapezoidal cross-section advantageously increases the cross-sectional area of conductive metal for the same effective cable diameter, e.g., as compared to strands having a circular cross-section. As illustrated in FIG. 1A, the overhead electrical cable 120A includes a second conductive layer 122b, as is typical, comprising a plurality of conductive strands 124b that are helically wound around the first conductive layer 122a. It will be appreciated that such overhead electrical cables may include a single conductive layer, or more than two conductive layers, depending upon the desired use of the overhead electrical cable.

FIG. 1B illustrates an embodiment of an overhead electrical cable 120B that is similar to the electrical cable illustrated in FIG. 1A, wherein the strength member 128 comprises a plurality of individual fiber-reinforced strength elements (e.g., strength element 129) that are stranded or twisted together to form the strength member 128. Although illustrated in FIG. 1B as including seven individual strength elements, it will be appreciated that a multi-element strength member may include any number of strength elements that is suitable for a particular application.

Figure 2A:
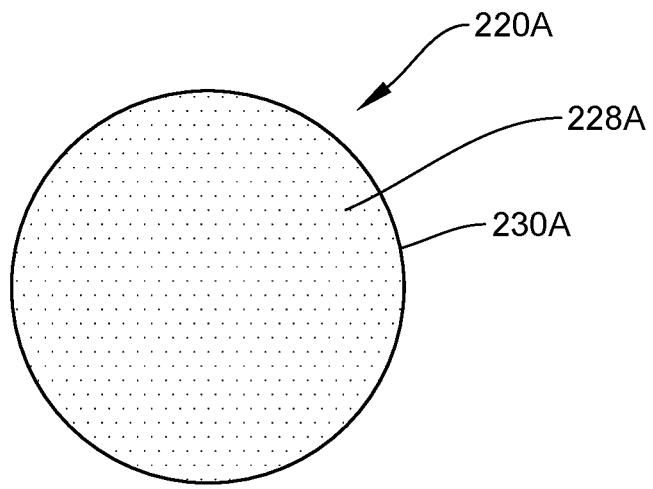
FIGS. 2A and 2B illustrate cross-sectional views of composite strength elements that are configured for use in an overhead electrical cable.
Figure 2B:
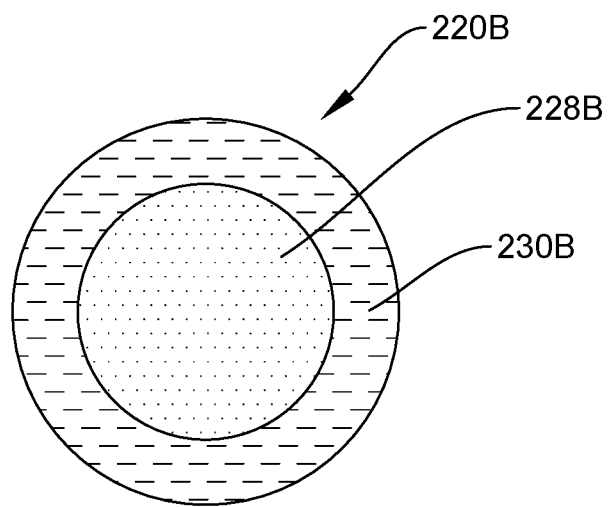

FIGS. 2A and 2B illustrate cross-sectional views of two examples of a fiber-reinforced composite strength element. FIG. 2A illustrates a fiber-reinforced strength element 220A having an inner core 228A that includes longitudinally-extending carbon reinforcing fibers in a polymer matrix, such as in a thermoplastic polymer or a thermoset polymer. The inner core 228A is surrounded by an outer polymer layer 230A fabricated from an insulating (e.g., high dielectric) polymer such as PEEK (polyether ether ketone). The layer 230A protects the carbon fibers of the inner core 228A from contact with the conductive layer (see FIG. 1), which may cause galvanic corrosion of the aluminum. In the embodiment illustrated in FIG. 2B, the strength element 220B includes an inner core 228B of longitudinally-extending carbon fibers in a polymer matrix and an outer layer 230B of insulative glass fibers (e.g., continuous glass fibers) in a polymer matrix. The outer layer 230B of glass fibers provides robust protection of the carbon fibers from contact with the conductive layer and provides enhanced flexibility to the strength element 220B so that the strength element and the electrical cable may be wrapped onto a spool for storage and transportation without damaging the strength element 220B. Typically, when the strength member is constructed from multiple strength elements, the individual strength elements will have a smaller diameter than a single element strength member. See FIGS. 1A and 1B above. Such strength members may include a layer (e.g., a wrapping) surrounding the bundle of strength elements. It will also be appreciated that not all strength members will require an insulative layer.

As noted above, the fiber-reinforced composite from which the strength elements are constructed includes reinforcing fibers that are operatively disposed in a binding matrix. The reinforcing fibers may be substantially continuous reinforcing fibers that extend along the length of the fiber-reinforced composite, and/or may include short reinforcing fibers (e.g., fiber whiskers or chopped fibers) that are dispersed through the binding matrix. The reinforcing fibers may be selected from a wide range of materials, including but not limited to, carbon, glass, boron, metal oxides, metal carbides, high-strength polymers such as aramid fibers or fluoropolymer fibers, basalt fibers and the like. Carbon fibers are particularly advantageous in many applications due to their very high tensile strength, and/or due to their relatively low coefficient of thermal expansion (CTE).

The binding matrix may include, for example, a plastic (e.g., polymer) such as a thermoplastic polymer or a thermoset polymer. For example, the binding matrix may include a thermoplastic polymer, including semi-crystalline thermoplastics. Specific examples of useful thermoplastics include, but are not limited to, polyether ether ketone (PEEK), polypropylene (PP), polyphenylene sulfide (PPS), polyetherimide (PEI), liquid crystal polymer (LCP), polyoxymethylene (POM, or acetal), polyamide (PA, or nylon), polyethylene (PE), fluoropolymers and thermoplastic polyesters. Other examples of polymeric materials useful for a binding matrix may include addition cured phenolic resins, e.g., bismaleimides (BMI), polyetheramides, various anhydrides, or imides.

The binding matrix may also include a thermosetting polymer. Examples of useful thermosetting polymers include, but are not limited to, benzoxazine, thermosetting polyimides (PI), polyether amide resin (PEAR), phenolic resins, epoxy-based vinyl ester resins, polycyanate resins and cyanate ester resins. In one exemplary embodiment, a vinyl ester resin is used in the binding matrix. Another embodiment includes the use of an epoxy resin, such as an epoxy resin that is a reaction product of epichlorohydrin and bisphenol A, bisphenol A diglycidyl ether (DGEBA). Curing agents (e.g., hardeners) for epoxy resins may be selected according to the desired properties of the fiber-reinforced composite strength member and the processing method. For example, curing agents may be selected from aliphatic polyamines, polyamides and modified versions of these compounds. Anhydrides and isocyanates may also be used as curing agents.

The binding matrix may also be a metallic matrix, such as an aluminum matrix. One example of an aluminum matrix fiber-reinforced composite is illustrated in U.S. Pat. No. 6,245,425 by McCullough et al., noted above.

One configuration of a composite strength member for an overhead electrical cable that is particularly advantageous is the ACCC® composite configuration that is available from CTC Global Corporation of Irvine, CA and is illustrated in U.S. Pat. No. 7,368,162 by Hiel et al., noted above. In the commercial embodiment of the ACCC® electrical cable, the strength member is a single element strength member of substantially circular cross-section that includes an inner core of substantially continuous reinforcing carbon fibers disposed in a polymer matrix. The core of carbon fibers is surrounded by a robust insulating layer of glass fibers that are also disposed in a polymer matrix, and are selected to insulate the carbon fibers from the surrounding conductive aluminum strands. See FIG. 2B. The glass fibers also have a higher elastic modulus than the carbon fibers and provide bendability so that the strength member and the electrical cable can be wrapped upon a spool for storage and transportation.

Fiber-reinforced composite strength members that are useful in overhead electrical cables may be characterized in several ways. One characterization may be the length of the strength member. For example, strength members for overhead electrical cables are typically produced in very long lengths. In certain characterizations, the as-produced strength member may have a length of at least about 1000 meters, such as at least about 3500 meters, such as at least about 5000 meters, or even at least about 7500 meters. Often, immediately upon production of the strength member, the strength member is typically wrapped around a spool (e.g., a bobbin) for storage and/or transport of the strength member, such as for transport to a stranding facility where the strength member is stranded with an electrical conductor to form an electrical cable. Although the strength member of the present disclosure does not have a particular upper limit for its length, as a practical matter the storage/transport spool will have a maximum capacity for the strength member of not greater than about 9000 meters, such as not greater than about 8000 meters. It will be appreciated that the maximum capacity of the spool will depend upon the diameter of the strength member (or, for example, the number of strength elements making up the strength member) that is wrapped around the spool.

The length of the fiber-reinforced composite strength member may also be characterized when the electrical cable is formed, e.g., when the strength member is stranded with an electrical conductor. As noted above, this typically occurs during a stranding operation where the strength member is pulled from a spool, is stranded with an electrical conductor (e.g., with conductive strands), and the thus-formed electrical cable is wrapped around another spool for storage and/or transport of the electrical cable. Because the conductive strands add volume in addition to the volume of the strength member, the length of the electrical cable that can be stored on a spool is reduced as compared to the strength member alone. Thus, for example, the length of the electrical cable and the length of the strength member in this state will typically be not greater than about 4500 meters, such as not greater than about 4000 meters.

The length of the electrical cable and of the underlying fiber-reinforced composite strength member may also be characterized when the electrical cable is installed onto support towers to form the electrical line. To form the electrical line, the electrical cable is pulled from a spool and is operatively attached to support towers (e.g., pylons) so that the electrical cable is suspended at a safe distance above the ground. The electrical cable must be cut at certain intervals along the path of the electrical line and reconnected using cable hardware such as conductive splices and/or dead end structures. The length of the electrical cable may be as short as the distance between two adjacent support towers (e.g., when the electrical line makes a turn), or may span several support towers before being cut and reconnected using hardware. Thus, the installed electrical cable and the underlying strength member may have a length of at least about 50 meters, such as at least about 100 meters, such as at least about 250 meters or greater, or at least about 500 meters or greater. Some electrical lines, may have a length of up to about 3000 meters, for example lines strung across rivers or valleys in a single span, or lines across uninterrupted terrain supported by multiple towers creating multiple spans.

As is noted above, the fiber-reinforced composite strength member may have a range of diameters, e.g., diameter of a circular cross-section, the effective diameter of a non-circular cross-section, or the effective diameter of a plurality of stranded or twisted composite strength elements that form the strength member. Although there is no particular lower limit on the diameter, the diameter will typically be at least about 1 mm, such as at least about 2 mm or at least about 3 mm. Likewise, although there is no particular upper limit on the diameter of the strength member, the diameter will typically be not greater than about 30 mm, such as not greater than about 20 mm, such as not greater than about 15 mm, such as not greater than about 11 mm.

Fiber-reinforced composite strength members that are configured for use in an overhead electrical cable may also be characterized in terms of a minimum tensile strength that is necessary to be safely installed onto the support towers under high mechanical tension. In this regard, it is generally desirable that the strength member have a tensile strength of at least about 1900 MPa, such as at least about 2000 MPa, such as at least about 2050 MPa. There is not practical upper limit on the tensile strength of the strength member, as it is typically desired to have as a high of a tensile strength as possible. As a result, the upper limit on the tensile strength is only limited by the available materials, e.g., the tensile strength of available reinforcing fibers. Given the tensile strength of currently available reinforcing fibers, the practical upper limit on the tensile strength is about 3500 MPa.

Although tensile strength is one primary characteristic of the fiber-reinforced composite strength member, other characteristics may be desirable for use in a particular application, such as in an overhead electrical cable. For example, it is also desirable that the strength member in an overhead electrical cable have a low coefficient of thermal expansion (CTE) to reduce the occurrence of line sag when the electrical line becomes overheated. For example, the strength member may have a CTE of not greater than about $30 \times 10^{-6}/°$ C., such as not greater than about $20 \times 10^{-6}/°$ C., such as not greater than about $10 \times 10^{-6}/°$ C., such as not greater than about $7.5 \times 10^{-6}/°$ C., such as not greater than about $5 \times 10^{-6}/°$ C., or even not greater than about $2.5 \times 10^{-6}/°$ C. In one characterization, the CTE of the strength member is not greater than about $2.0 \times 10^{-6}$. In some embodiments, the strength member may even have a slightly negative CTE, such as down to about $-0.5 \times 10^{-6}/°$ C.

Although the foregoing characteristics of a fiber-reinforced strength member are disclosed as being desirable for use in an overhead electrical cable, similar characteristics may also be desirable when the strength members disclosed herein are used in other structures, such as bridge cables and messenger cables.

According to the present disclosure, the fiber-reinforced composite strength member includes at least one fiber-reinforced composite strength element, and the strength element includes at least one elongate and continuous optical fiber. The optical fiber may be embedded within the fiber-reinforced composite (e.g., within the binding matrix) and may extend from a first end of the strength element to a second end of the strength element. The optical fiber is configured to transmit light from the first end of the strength element to the second end of the strength element. By proper selection of the optical fiber(s), placement of the optical fiber(s) and preparation of the ends of the fiber-reinforced composite strength element, the strength element can be interrogated using the system and method disclosed herein to assess the structural integrity of the strength element, e.g., to assess the structural integrity of the strength member that includes the strength element. Although a single optical fiber may be utilized, the efficacy of the systems and methods disclosed herein may be improved by including multiple optical fibers in spaced apart relation within the fiber-reinforced composite. As such, the present disclosure may refer to the use of optical fibers (e.g., a plurality of optical fibers) even though the present disclosure is not so limited.

The term "optical fiber" used herein refers to an elongate and continuous fiber that is configured to transmit incident light down the entire length of the fiber. Typically, optical fibers will include a transmissive core and a cladding layer surrounding the core that is fabricated from a different material (e.g., having a different refractive index) to reduce the loss of light out of the transmissive core, e.g., through the exterior of the optical fiber. This is in contrast to, for example, a structural fiber (e.g. a structural glass fiber) that has a homogenous composition and is typically placed in a composite material as a fiber tow, i.e., an untwisted bundle of individual filaments.

The optical fibers used in the strength element can be, for example, single mode optical fibers or a multimode optical fibers. A single mode optical fiber has a small diameter transmissive core (e.g., about 9 µm in diameter) surrounded by a cladding having a diameter of about 125 µm. Single mode fibers are configured to allow only one mode of light to propagate. A multimode optical fiber has a larger transmissive core (e.g., about 50 µm in diameter or larger) that allows multiple modes of light to propagate. It is an advantage of the present disclosure that the system and method for interrogation can use virtually any type of optical fiber, and therefore single mode optical fibers may be preferred for their relatively low cost as compared to multimode optical fibers. The optical fibers may be fabricated entirely from one or more polymers. However, polymer optical fibers may not have sufficient heat resistance to withstand manufacture and/or use of the strength element, and it is currently preferred to utilize single mode glass fibers.

The optical fibers may be disposed linearly along the length of the strength element. Stated another way, the optical fibers may be longitudinally oriented and co-linear with a central longitudinal axis of the strength element. In an alternative arrangement, one or more of the optical fibers may be non-linear, i.e., may be wrapped (e.g., helically twisted) relative to the central longitudinal axis of the strength element.

One feature of the fiber-reinforced composite strength element according to the present disclosure is that at least one end of the strength element has an end surface that is configured to facilitate the transmission of light (e.g., infrared light) through the strength element, e.g., into the optical fiber disposed within the fiber-reinforced composite, without the need to isolate (e.g., separate) the optical fiber from the fiber-reinforced composite. Because optical fibers are extremely small (e.g., having a diameter of only about 250 µm, including an outer coating), they are difficult to readily locate (e.g., visually locate) within the fiber-reinforced composite. According to the present disclosure, it is not required to isolate the optical fiber (e.g., the end of the optical fiber) from the fiber-reinforced composite surrounding the optical fiber for the interrogation system and method to be implemented. That is, the strength element may be configured such that the optical fiber is embedded in the fiber-reinforced composite and does not extend beyond the end surface of the fiber-reinforced composite. For most applications, it will be desirable that each end of the strength element (e.g., the first and second ends) will be configured to enable the light to be transmitted into the strength element at a first end, and transmitted out of the strength element and detected at a second end.

In another characterization, the end surface of the strength element may be described as being very smooth. For example, the end surface may be characterized as being a polished end surface, e.g., as having been polished to remove ridges, abrasions, or other small surface features. As is discussed below, the end surface of the strength element may be polished with a relatively fine abrasive grit to remove surface features that may result from cutting the strength element with a cutting blade.

In another characterization, the end surface of the strength element may be described as being substantially orthogonal to a central, longitudinal axis of the strength element. That is, the end surface may be characterized as a planar surface that is oriented at or vey near 90° to the longitudinal axis. As used herein, substantially orthogonal means that the end surface is oriented at least within ±5° of 90° to the longitudinal axis. In one characterization, the end surface is oriented within ±2° of 90° to the longitudinal axis of the strength element. For example, the end surface may be oriented within ±1° of 90° to the longitudinal axis, such as within ±0.5° of 90° to the longitudinal axis. Such an orthogonal end surface may be formed, for example, by cutting the end of the fiber-reinforced composite while the composite is held (e.g., is gripped) in such an orthogonal position relative to the cutting blade that is used to cut the end of the composite. It has been found that forming an end surface having an orthogonal relationship to the longitudinal axis of the strength element may facilitate the transmission of light into and out of the optical fibers without necessitating that the light source be directly (e.g., physically) coupled to the optical fiber, and without requiring that the optical fiber be located (e.g., visually identified) within the composite. One example of a tool that may be used to form such an end surface is described below.

The system and method disclosed herein for the interrogation of a strength element can be used to assess the structural integrity of the strength element, e.g., to determine whether the strength element (e.g., the fiber-reinforced composite) includes any fractures or other similar defects, e.g., from manufacture or handling of the strength element. To provide a reliable assessment, and depending upon the size and configuration (e.g., diameter and/or cross-section) of the strength element, it may also be desirable that the strength element include at least a second elongate and continuous optical fiber, e.g., embedded within the fiber-reinforced composite. The strength element may also include at least a third optical fiber or even at least a fourth optical fiber to provide a reliable assessment, e.g., to increase the likelihood that a fracture in the fiber-reinforced composite will also disrupt (e.g., fracture) an optical fiber, e.g., will cause the light transmittance of the optical fiber to become greatly reduced or eliminated. Multiple optical fibers are particularly useful when a single strength element is used as a strength member. It is desirable that the optical fibers conform with the characteristics noted above, e.g., that the optical fibers do not extend beyond the end surface(s) of the fiber-reinforced composite.

When the fiber-reinforced composite strength element includes three or more optical fibers, the optical fibers may be concentrically disposed around the longitudinal central axis of the strength element, and may be disposed equidistant from the longitudinal axis and/or equidistant from each other. This may increase the ability of the system and method to detect defects in the fiber-reinforced composite by distributing the optical fibers evenly through the cross-section of the strength element. In one particular embodiment, the strength element includes at least four optical fibers that are disposed in a concentric manner around the longitudinal axis and are approximately equally spaced relative to each other, e.g., at about 90° angles about the cross-section of the strength element. In one characterization, the longitudinal central axis of the strength element is free of optical fibers, e.g., the strength element does not include a centrally disposed optical fiber. It is believed that placing an optical fiber along the central axis will not meaningfully contribute to the efficacy of the interrogation system and method, as there is a very low probability that a fracture will pass near the central axis of the strength element without also passing very near, and disrupting, one or more of the optical fibers that are disposed around and spaced from the central axis.

In the embodiments described above wherein the strength element comprises a central composite core of reinforcing fibers, such as a core comprising carbon fibers, and an insulating layer surrounding the central core, such as a layer of glass fibers in the binding matrix, the optical fibers may advantageously be embedded at different locations within the fiber-reinforced composite, i.e., at different distances from the central axis and/or at different angles relative to the central axis of the core at the interface of the central core and the insulating layer. Placement at this interface may enhance the probability of the optical fibers being disrupted when a fracture occurs in the strength element.

Figure 3A:
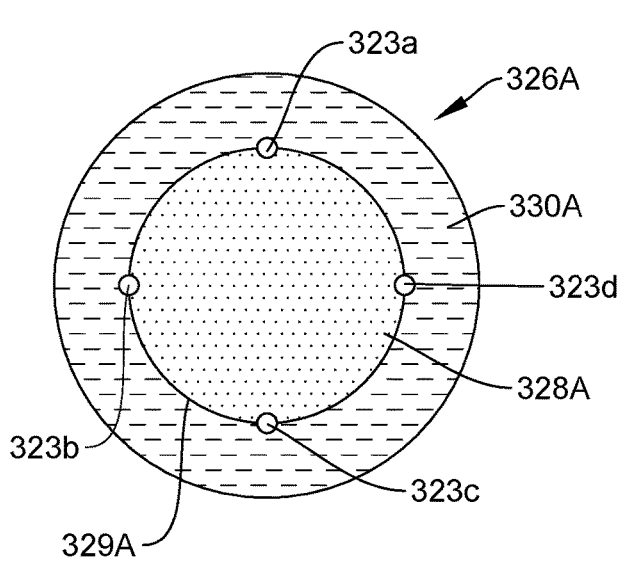
Figure 3B:
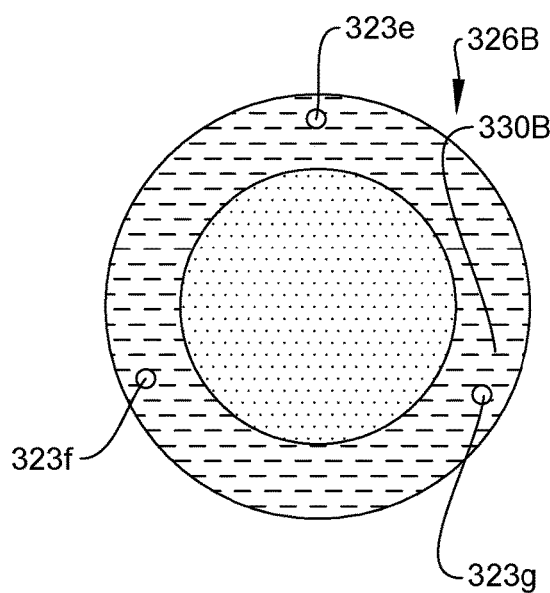
Figure 3C:
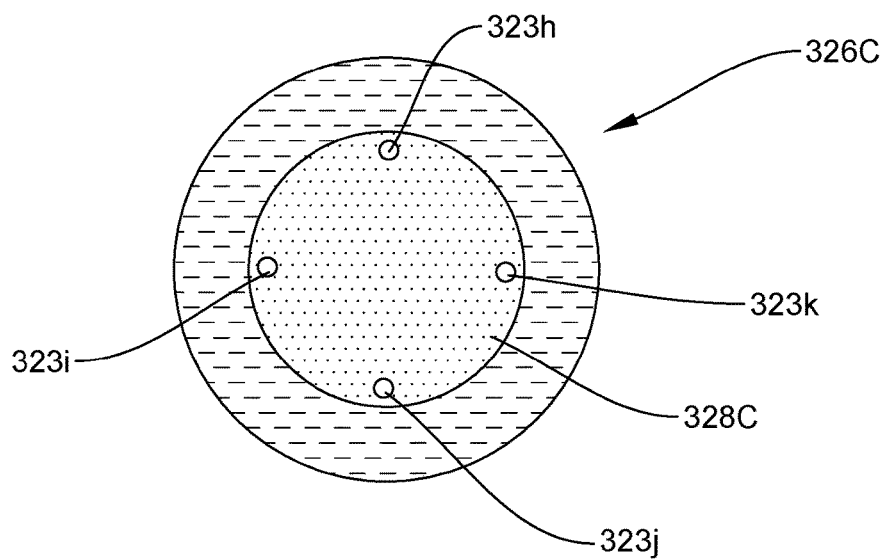

Referring to FIGS. 3A to 3F, a cross-sectional view of strength elements according to embodiments of the present disclosure are illustrated. The configuration of the fiber-reinforced sections of the strength elements 326A to 326F is similar to the strength element illustrated in FIG. 2B, and includes an inner core of high tensile strength fibers surrounded by an outer layer of an insulative material, e.g., an inner core comprising carbon fibers surrounded by an outer layer comprising glass fibers. As illustrated in FIG. 3A, the strength element 326A includes four optical fibers 323*a-d* that are concentrically disposed in the strength element 426 around and spaced-apart from the central axis. As illustrated in FIG. 3A, the fibers 323*a-d* are placed at or very near an interface 329A between the inner core 328A and the outer layer 330A. The four optical fibers are also evenly spaced about the central axis, e.g., are radially spaced apart by about 90°. As illustrated in FIG. 3B, optical fibers 323*e-g* are placed very near the outer surface of the strength element 326B, and are radially spaced apart by about 120°. Placement very near the outer surface may be advantageous for early detection of fractures that occur (e.g., are initiated) on the outer surface. However, the optical fibers 323*e-g* should not be placed so close to the outer surface that they are exposed and subject to damage, e.g., due to direct contact with the outer conductive layer. FIG. 3C illustrates an embodiment of a strength element 326C, wherein four optical fibers 323*h*-323*k* are embedded in the inner core 328C. FIG. 3D illustrates an embodiment of a strength element 326D wherein the five optical fibers are placed at the interface 329D between the inner core 328D and the outer layer 330D. The five optical fibers are substantially equidistant from a central axis of the strength element and are substantially equally spaced apart, i.e., radially spaced apart by about 72°. FIG. 3D illustrates that the strength element may include any number of optical fibers, including five or more optical fibers. FIG. 3E illustrates an embodiment of a strength element 326E wherein optical fibers of a first grouping are disposed at a first distance from a central axis of the strength element, and optical fibers of a second group are disposed at a second distance from the central axis, where the second distance is different than the first distance. FIG. 3F illustrates an embodiment of a strength element 326F wherein an optical fiber is disposes along a central axis of the strength element 326F and is surrounded by optical fibers that are spaced apart from the central axis. It will be appreciated that the arrangement of the optical fibers within the strength element illustrated in FIGS. 3A to 3F are merely examples of possible arrangements, and the present disclosure is not limited to these particular arrangements.

As noted above, it may be advantageous to form a smooth end surface to facilitate the transmission of light into and out of the optical fiber, e.g., by polishing the end surface. It has been found that many commercially available optical fibers include two or more polymeric layers surrounding the transmissive core and cladding layer, namely an inner layer of a relatively soft polymeric material and an outer layer of a harder polymeric for protection of the glass core. The function of the softer polymer layer is to reduce light losses due to micro-bending of the optical fiber in certain applications. However, it has been found that when an end surface of a strength element, including an end of the optical fiber, is subjected to polishing, the softer polymer layer may be displaced and at least partially overcoat the transmissive glass core of the optical fiber due to the mechanical action of and/or the heat generated by the polishing process. Even a small amount of overcoating by the displaced polymer may inhibit the transmission of light into and/or out of the optical fiber. Thus, in one characterization, the optical fibers do not include a softer polymer layer. For example, the optical fiber may include a transmissive glass core and cladding layer for the transmission of the light, and a single protective (e.g., hard) polymer layer surrounding the glass core and cladding, e.g., with no intervening material layer. As a result, the tendency overcoat the end of the glass core with displaced polymer will be reduced or eliminated, and the transmittance of light into and out of the optical fiber will be improved. In one characterization, the single protective polymer layer will have a tensile modulus of at least about 1000 MPa, such as up to about 4500 MPa. Examples of such polymers may include acrylate-based polymers and polyimides. In another characterization, the optical fiber may be free of any polymeric (e.g., protective) layers.

The strength elements described above may be fabricated by means known to those of skill in the art, including the methods described in the above-listed U.S. patents. In one particular embodiment, the strength element is formed by pultrusion process whereby tows of continuous reinforcing fibers (e.g., carbon and glass fibers) are pulled through a binding matrix material (e.g., through an epoxy resin bath), which is subsequently cured to bind the fibers and form a fiber-reinforced composite. Optical fibers are provided by the manufacturer in continuous lengths (e.g., of many thousands of meters) on spools in a manner similar to the fiber tows (e.g., carbon fiber tows and glass fiber tows). Therefore, the optical fibers can be integrated into the pultrusion process along with the reinforcing fibers without great difficulty.

Thus, one embodiment of the present disclosure is directed to a method for the manufacture of an elongate fiber-reinforced composite strength element that is configured for use in a strength member. The method may include the steps of forming an elongate fiber-reinforced composite having a longitudinal central axis, and comprising a binding matrix and a plurality of reinforcing fibers disposed in the binding matrix. At least a first optical fiber is embedded into the fiber-reinforced composite, e.g., during the formation of the composite, such that the optical fiber extends from a first end of the composite to the second end of the composite. For example, the optical fibers may be integrated into a pultrusion process wherein the reinforcing fiber tows are impregnated with a resin which is cured form the binding matrix. Optical fibers are typically provided on spools (bobbins) in a manner similar to the reinforcing fiber tows, and therefore can be pulled through a pultrusion system in a similar manner. In one embodiment, the optical fibers are provided with one or more polymer layers, and the polymer layers are removed before the optical fibers are combined with the reinforcing fibers and impregnated with a resin. For example, the optical fibers may be subjected to a heat treatment step to remove (e.g., to volatilize) the polymer layer. In one embodiment, the heat treatment step includes directing a laser at the optical fiber just before the optical fiber is commingled with the reinforcing fibers.

As is noted above, the optical fibers may be oriented linearly (e.g., co-linear with the central longitudinal axis of the strength element), or may be wrapped (e.g., helically wound) relative to the central longitudinal axis of the strength element.

After the formation (e.g., by pultrusion) of an adequate length of the fiber-reinforced composite, the composite is then cut proximate to the first end of the composite to form a first cut end surface that is substantially flat. The cut end is polished to form an elongate fiber-reinforced composite strength element having a polished first end surface, the polished first end surface comprising fiber-reinforced composite and a first end of the optical fiber. As a result of the foregoing method, the polished end of the strength element, including the optical fiber, will have the ability to efficiently receive and transmit light through the optical fiber, e.g. without requiring that the optical fiber be physically isolated from the surrounding fiber-reinforced composite.

As is discussed above, the strength element may include one or a plurality (e.g., four or more) of the optical fibers, and the plurality of optical fibers may be configured (e.g., embedded within) the fiber-reinforced composite to enhance the probability of the optical fibers to become disrupted due to a fracture or other defect in the surrounding composite. Thus, the foregoing method may include embedding a plurality of optical fibers, e.g., two or more optical fibers, as is described above.

In a pultrusion process, after the binding matrix has sufficiently cured, the pultruded fiber-reinforced composite is typically gathered on a spool. As the length of the fiber tows and the optical fibers greatly exceeds the length of composite that can be stored on a spool, the elongate composite is eventually cut before the storage capacity of the spool is exceeded. Typically, such a cut is made by a simple shearing action (e.g., using bolt cutters) or a toothed (serrated) saw that results in a rough and splintered end of the fiber-reinforced composite. According to one embodiment, it may be desirable to interrogate the strength element while the strength element is disposed on the spool. Accordingly, the fiber-reinforced composite may be wrapped on the spool in a manner such that both of the first and second ends of the composite are exposed, e.g., both ends are separated from the bulk of the spooled composite, often by placing one or both ends through a side aperture in the spool. Thus, in one embodiment, at least one end, and preferably both ends of the fiber-reinforced composite, are cut and polished to form the strength element (e.g., as described above) so that the interrogation system and method may be applied to the strength element while the strength element is disposed on the spool.

In one embodiment, the manufacturer of the strength element may desire to "stress-test" the strength element before the strength element is shipped, e.g., before the strength element is shipped to a stranding facility for stranding of a strength member formed from the strength element with a conductor to form an electrical cable. Such a stress-test may include unwinding the strength element from one spool and winding it onto another spool, where the strength element is threaded through one or more wheels (e.g., small sheaves) between the two spools. Proper selection of wheel size and wheel placement causes a known stress to be applied to the strength element to confirm that the strength element does not fracture under that known stress, e.g., to confirm that there are no significant manufacturing defects in the strength element. Thus, according to one embodiment, the system and method for interrogation of the strength element is applied to the strength element after the stress test to determine if the strength element passed the stress test, e.g., to determine if the strength element fractured during the stress test. For example, the system and method can be applied after the stress-test when the strength element is wrapped on the second spool. If it is determined that the strength element passed the stress-test using the interrogation system and method, the spooled strength element may be shipped for stranding.

In any event, in one embodiment the cutting step may be carried out in a manner that has a high probability of forming an orthogonal end surface as is discussed above. For example, the cutting step may include cutting the fiber-reinforced composite with a mechanically actuated (e.g., powered) cutting edge. A gritted cutting edge, one that cuts through a material primarily due to the presence of abrasive grit (i.e., a high hardness particulate material) on the cutting edge, is generally preferred over a cutting edge that includes cutting teeth. Although the use of fine cutting teeth is not precluded for cutting the fiber-reinforced composite, it is believed that cutting teeth will leave a rougher surface that abrasive grit, resulting in a more difficult (e.g., more time consuming) polishing step after the cutting step. In one characterization, the gritted cutting edge comprises abrasive grit having a size that is super fine or coarser, e.g., a size of at least about 30 μm (about 600 grit), such as at least about 40 μm (about 360 grit) or even at least about 68 μm (about 220 grit). It will be appreciated that the selection of cutting grit may be made by taking into account the speed (e.g., rotational velocity) of the cutting edge and the desire for a rapid cut and polish, i.e., a coarser grit may cut faster but may necessitate a longer subsequent polish time.

To form a substantially orthogonal end surface as described in certain characterizations above, the cutting step may include securing (e.g., mechanically securing) the first end of the fiber-reinforced composite such that the first end is substantially orthogonally disposed relative to the cutting edge (e.g., to the cutting blade) during the cutting step. For example, the fiber-reinforced composite may be mechanically clamped so that the composite is orthogonally disposed to the cutting edge and is not able to move off-axis in any appreciable manner during the cutting step.

After cutting, the end surface may be polished to provide a smooth end surface. For example, the polishing step may include polishing the cut end surface with a polishing surface. For example, the polishing surface may include abrasive grit having an ultrafine size, for example a grit size of not greater than about 25 μm (800 grit) or even not greater than about 22 µm (1000 grit). Characterized another way, the polishing step may be performed with abrasive grit that is smaller than the abrasive grit used in the cutting step.

As is noted above, some optical fibers are provided from the manufacturer with a soft polymer layer to reduce microbend losses, and such a soft polymer may overcoat the end of the optical fiber transmissive core during the cutting and/or polishing steps. If the optical fiber includes such a layer, one technique to reduce or eliminate such overcoating is to temporarily harden the soft polymer layer to reduce its susceptibility to being displaced and overcoating the transmissive core of the optical fiber. For example, the end surface may be cooled before and/or during the cutting and polishing step to harden the polymer layer. In one characterization, the end surface is cooled by the application of a cooled liquid or cooled gas to the end surface. Examples include the application of a compressed gas (e.g., compressed nitrogen gas, carbon dioxide gas, hydrocarbon gas, freon or the like) to the end surface before and/or during the cutting and polishing steps.

The method of forming the end surface of the strength element is described above as including mechanically cutting and polishing the end of the fiber-reinforced composite, e.g., using a cutting edge and a polishing surface. However, it is contemplated that a strength element having the desired end surface may be formed by other means. For example, a water jet or a laser may be used to obtain an end surface having the desirable properties for effective light transmission in the interrogation systems and methods disclosed herein.

The foregoing describes the manufacture of a strength element having an end surface(s) that are configured (e.g., cut and polished) to facilitate the transmission of light into and out of an optical fiber embedded in the strength element. This permits the manufacturer of the strength element to interrogate the strength element before it is shipped to the end user, or is shipped to an intermediary such as a facility that strands the strength element with a conductor to form an electrical cable. The system and method can also implemented at other points, in addition to or in place of the manufacturer. Such implementation may require that the end user and/or the intermediary also prepare the ends of the strength element in accordance with the foregoing description. For example, as is noted above, when a strength member (e.g., including one or more strength elements) is stranded with an electrical conductor to form an electrical cable, the strength member is pulled from a spool and is stranded with conductive strands. Because the conductive strands add volume in addition to the volume of the strength member, the length of the electrical cable that can be stored on a spool is reduced as compared to the spool capacity for a strength member alone. Thus, the strength member must be cut at some point, e.g., when the electrical cable spool reaches its capacity. As a result, the strander may wish to prepare the ends of the strength element in accordance with the foregoing methods to enable the strander, or the strander's customer, to interrogate the electrical cable after the electrical cable is wrapped onto a spool.

Similarly, as is disclosed above, when the strength member is installed (e.g., when an overhead electrical cable including the strength member is strung onto support towers), the length of electrical cable must be cut many times to accommodate distances between support towers, particularly accounting for turns (e.g., angles) in the routing of the electrical line. Thus, in some embodiments, the strength element(s) may be cut and polished in accordance with the foregoing methods during installation of the electrical cable onto support towers.

In one embodiment of the present disclosure, a tool that is particularly useful for cutting and polishing a strength element is disclosed. The tool is configured to cut and polish the end of a fiber-reinforced composite in a single step, thereby reducing the amount of effort and potential for errors when cutting and polishing to form a strength element for interrogation. The tool includes a planar body, the planar body having a cutting edge along at least one edge of the planar body, and a polishing surface covering at least a portion of the planar body. An alignment member is operatively associated with the planar body and is configured to operatively align an elongate fiber-reinforced composite having a longitudinal axis with the planar body, such that the cutting edge of the planar body is configured to move and cut the composite substantially orthogonally to the longitudinal axis to form a cut surface, and the polishing surface is configured to polish the cut surface as the cutting edge moves through the composite.

The planar body that performs the cutting and polishing may take a variety of forms, e.g., a continuously moving polygonal surface as might be found in a belt sander. In one characterization, the planar body is substantially circular and is rotated (e.g., by an electric motor) to cut the fiber-reinforced composite. In this regard, the motor may be operatively connected to the planar body, where the motor is configured to rapidly rotate the planar body around a central axis of the planar body. Although the cutting edge may include a plurality of cutting teeth, it is advantageous to form the cutting edge with a gritted surface, as is described above, to minimize the formation of a rough and/or splintered end of the composite. In one characterization, the gritted cutting edge comprises abrasive grit having a size that is super fine or coarser, e.g., a size of at least about 30 µm (about 600 grit), such as at least about 40 µm (about 360 grit) or even at least about 68 µm (about 220 grit). It will be appreciated that the selection of abrasive cutting grit may be made by taking into account the speed (e.g., rotational velocity) of the cutting edge and the desire for a rapid cut and polish, i.e., a coarser abrasive grit may cut faster but may necessitate a longer polish time.

The planar body includes a polishing surface that covers the entire surface of the planar body, or only a portion thereof. The polishing surface may include abrasive grit having an ultrafine size, for example a grit size of not greater than about 25 µm (800 grit) or even not greater than about 22 µm (1000 grit). Characterized another way, the polishing surface may comprise abrasive grit that is finer than the abrasive grit used on the cutting edge. In one characterization, the polishing surface includes at least two different abrasive grit sizes, where a coarser grit is applied nearer an outer portion of the polishing surface and a finer grit is applied nearer a central portion of the polishing surface. In this manner, the cut surface may first encounter the coarser polishing grit to rapidly remove larger surface features, and then encounter the finer polishing grit to remove smaller surface features.

To facilitate the application of a small amount of pressure on the end surface of the fiber-reinforced composite by the polishing surface, the polishing surface may be raised slightly above the underlying surface of the planar body. For example, the polishing surface may be raised above the surface of the planar body by at least about 0.1 mm, such as at least about 0.3 mm and not greater than about 1.2 mm, such as not greater than about 1.0 mm. For example, the polishing surface may comprise abrasive grit that is disposed on a thin substrate (e.g., a paper substrate) that is attached (e.g., adhered) to an otherwise smooth planar surface. Alternatively, or in addition to the raised polishing surface, the tool may include a mechanism (e.g., a spring) that is configured to push the polishing surface towards the end of the fiber-reinforced composite that is being polished.

The tool may advantageously be a handheld tool, e.g., a tool that can be carried and manipulated by an operator in a variety of environments. For example, during installation of an overhead electrical cable, it is necessary to cut the electrical cable while the operator is located high above the ground, often in a vertically movable bucket. Providing a tool that can be easily carried in such a small space and can be manipulated by the operator provides a significant advantage. In this regard, the tool may include a battery to power movement of the planar body, e.g., movement of the cutting edge and polishing surface. The battery may be, e.g., a rechargeable battery. For example, to enhance the portability and ease of use of the tool, a battery having a capacity in the range of from about 2 amp-hours to about 12 amp-hours may be utilized. In another characterization, the battery may have a voltage of from about 12 volts to about 20 volts. Batteries having these characteristics may provide adequate power for the tool to reliably operate over a reasonable amount of time, while maintaining the tool in a form that is easily carried and manipulated by an operator.

The tool may also include a gripping portion (e.g., a handle) to facilitate gripping by the operator and free manipulation of the tool, e.g., in the nature of a handheld drill.

Certain fiber-reinforced composites may include materials (e.g., carbon fibers) that could present a hazard to an operator as the cutting edge and the polishing surface remove material from the surface in the form of dust. In one characterization, the tool includes a mechanism that is configured to capture dust that is generated during cutting and polishing. For example, the mechanism may be coupled to the planar body so that a partial vacuum is created to capture dust as the planar body moves, e.g., as the planar body rotates.

It will be appreciated that the cutting and polishing tool described herein may have a wide variety of applications, and is not limited to the cutting and polishing of fiber-reinforced composites to form strength elements as is described above.

The above-described strength elements having one or more optical fibers disposed therein may have use in many different applications, particularly as tensile strength members in various structures. In one embodiment of the present disclosure, the strength elements are used in strength members for overhead electrical cables.

In one embodiment, a method for the interrogation of a fiber-reinforced composite strength member, e.g., one configured for use with an overhead electrical cable, is disclosed. The strength member includes a strength element formed from a fiber-reinforced composite, the composite including a binding matrix and a plurality of reinforcing fibers operatively disposed within the binding matrix. As described above, at least a first optical fiber is embedded in the composite and extends along a length of the fiber-reinforced composite. The interrogation method includes the steps of operatively attaching a light transmitting device to a first end of the strength member, operatively attaching a light detecting device to a second end of the strength member, transmitting light from the light transmitting device through the first optical fiber and towards the light detecting device, and detecting the transmitted light by the light detecting device. In one characterization, if the transmitted light is not detected from one or more of the optical fibers, a further assessment can be made of the structural integrity of the strength member, as the absence of transmitted light from one or more of the optical fibers may indicate that the structural integrity of the strength member has been compromised.

The transmitted light may encompass light across a wide spectrum. For example, visible light (e.g., having a wavelength of from about 400 nm to about 700 nm) may be suitable for shorter lengths of a composite strength element, or if the luminosity of the light source is very high. However, visible light may be too attenuated for most applications, particularly over great lengths.

Advantageously, the wavelength of the transmitted light may lie primarily in the infrared region. For example, the wavelength of the transmitted light (e.g., the peak wavelength) may be at least about 700 nm, such as at least about 800 nm. Further, the wavelength of the transmitted light may be not greater than about 1200 nm, such as not greater than about 1000 nm. It is believed that light having a wavelength of greater than about 1200 nm will be difficult to detect at the second end of the strength element using conventional light sensors, such as a CCD or CMOS light sensor. It is a particular advantage that the light source may be an incoherent light source, e.g., as compared to a coherent (e.g., single phase) light source such as a laser. The use of lasers may be challenging, as lasers require a strong coupling to an individual optical fiber due to the small diameter of the coherent light. In contrast, the method disclosed herein may advantageously use an incoherent light source such as a light emitting diode (LED), a halogen lamp, or the like.

In one characterization, the light source is an LED and the step of transmitting the light comprises energizing the LED, e.g., using a battery or other power source. LEDs are reasonably inexpensive and mechanically robust. Because the strength element may include several optical fibers disposed at different positions across the cross-section of the strength element, it is desirable to transmit the light towards substantially the entire cross-section of the strength element so that sufficient light is transmitted into all of the optical fibers for detection at the opposite end of the strength element. In one characterization, this is achieved by moving the light source (e.g., the LED) while light is being transmitted. For example, the light source may be rotated (e.g., mechanically rotated using a motor) or otherwise actuated (e.g., moved back and forth, or oscillated) as light is being transmitted. In one particular characterization, the light source is rotated at a speed of at least about 5 rpm (revolutions per minute), such as at least about 10 rpm, as the light is being transmitted toward the end of the strength element.

In one embodiment, the strength element can have the characteristics substantially as described above, and can be fabricated as described above. For example, the end surface of the strength element may include the fiber-reinforced composite and the optical fiber(s), where the optical fiber(s) do not extend beyond the end surface. The end surface may be polished.

Alternatively, or in addition to the foregoing, an index-matching material (e.g., a fluid such as a gel) may be placed on the end surface (e.g., on the end of the optical fibers) to enhance light transmission into and/or out of the optical fibers. An index-matching material is a fluid material that has an index of refraction that is the same or very similar to the index of refraction of another material, e.g., of the transmissive core of the optical fiber, at the wavelength of interest as a reduction in wavelength leads to a higher index of refraction. In one embodiment, the method includes placing a small amount of index-matching gel on the end surface of the strength element before transmission of the light, where the index-matching gel has an index of refraction that is substantially the same as the index of refraction of the optical fiber core. In one embodiment, the index matching material has an index of refraction that is at least about 1.40, such as at least about 1.42 or even at least about 1.44. The index of refraction of the index matching material may be not greater than about 1.50, such as not greater than about 1.48. It has been found that even a small amount of index-matching gel placed on the end surface may greatly enhance the transmission of light into the optical fibers.

The interrogation method may be implemented after manufacture of the strength element, e.g., as the strength element is disposed on a spool. It may also be implemented after a stress-test (e.g., a bend test), as is described above. It may be implemented after the fabrication of an end product (e.g., after stranding the strength element(s) with a conductor), and may be implemented after installation, e.g., installation of the overhead electrical cable, to ensure the structural integrity of the electrical cable.

In another embodiment, a system is disclosed for the interrogation of a strength element. Although not limited thereto, the system may be used to implement the foregoing method for the interrogation of a strength element. For example, the system may be configured for the detection of a defect in a fiber-reinforced strength member, e.g., a strength member that is a component of overhead electrical cable. In this embodiment, the system includes an overhead electrical cable, the overhead electrical cable comprising a fiber-reinforced composite strength member. The strength member incudes a binding matrix, a plurality of reinforcing fibers operatively disposed within the binding matrix to form a fiber-reinforced composite section, at least a first optical fiber fully disposed within the fiber-reinforced composite section and along a length of the strength member. An electrical conductor disposed around and supported by the strength member to form the electrical cable. A light transmitting device is operatively connected to a first end of the strength member, where the light transmitting device comprises a light source that is configured to transmit light into the first end of the optical fiber. For example, the light may have a wavelength of at least about 300 nm and not greater than about 1700 nm. A light detecting device is operatively connected to a second end of the strength member and includes a light sensor that is configured to detect the light from the light transmitting device through a second end of the optical fiber.

As is discussed above, the light source may be configured to emit light having a wavelength in the infrared region, for example having a wavelength of at least about 700 nm, such as at least about 800 nm. Further, the light source may be configured to emit light having a wavelength of not greater than about 1200 nm, such as not greater than about 1000 nm. The light source may be any useful incoherent light source, including but not limited to, a halogen lamp or an LED. Advantageously, the light source may include a plurality of LEDs (e.g., LED panels) that are assembled to increase the area (e.g., the cross-sectional area) over which the light is transmitted. The light source may also be operatively attached to a mechanism such as a motor that is configured to move (e.g., rotate or oscillate) the light source as the light source transmits light. In this manner, a substantially homogenous column or beam of light is transmitted toward the end surface of the strength element, substantially increasing the likelihood that each optical fiber in the strength element will receive a sufficient quantity of light to be detected at the second end of the strength element.

The light source may be powered by any conventional means. In one embodiment, the light source is powered by a battery, e.g., a rechargeable battery. For example, to enhance the portability and ease of use of the light source, a battery having a capacity in the range of from about 2 amp-hours to about 12 amp-hours may be utilized. In another characterization, the battery may have a voltage of from about 12 volts to about 20 volts. Batteries having these characteristics may provide adequate power for the light source to reliably operate over a reasonable amount of time, while maintaining the light source in a form that is easily carried and manipulated by an operator.

The light source may also be spaced away from the end of the strength element during use. Despite being spaced apart, the light from the light source will nonetheless be capable of passing into the optical fiber(s) due to the structure of the strength element end, as is discussed above. In one characterization, the light source (e.g., the front surface of the light source) is spaced away from the end surface of the strength element during use by at least about 0.1 mm, such as at least about 1.0 mm. In another characterization, the light source is spaced away from the end surface by not greater than about 150 mm, such as by not greater than about 100 mm, such as by not greater than about 30 mm.

The strength member may include one or more strength elements as described above, including strength elements having a plurality of optical fibers disposed in the composite material, such as at least about two, at least about three or at least about 4 optical fibers. The strength member may have a range of lengths as is discussed above, and may be implemented at different points during the manufacture and installation of the strength member.

The light detecting device may include a light sensor for the detection of the transmitted light. Although it may be possible in some circumstances for a user to examine the light directly (e.g., with a naked eye), a light detecting device including a light sensor, may enable the detection of relatively weak light, and may enable the recordation of images and/or data for remote analysis and/or for archival purposes. For example, the light sensor may be a charge-coupled device (CCD) or a complementary metal-oxide-semiconductor (CMOS) device. The light detecting device may include, for example, a concave lens that is disposed between the end of the composite strength member and the light sensor and is configured to focus the transmitted light onto the light sensor. The light sensor may also be connected to a computing device for analyzing and/or displaying the image created by the sensor. The connection may be a wired connection, or may be a wireless connection facilitated through the use of an antenna, for example.

Non-limiting examples of a light transmitting device and a light detecting device that may be used in the foregoing system or a similar system are described below.

In one embodiment, a device for the transmission of light into an end of an optical fiber that is embedded in an elongate structural member (e.g., a strength element as described herein) is disclosed. The device may include a substantially rigid structural body, and a bore disposed at least partially through the structural body and having an aperture at a first end of the bore. The aperture and bore are configured (e.g., shaped and sized) to receive an end of an elongate structural member having at least a first optical fiber embedded along a length of the structural member. The device includes a light source disposed at least partially within the structural body and proximate a second end of the bore, and the light source is configured to transmit light into the bore and toward the end of the elongate member when the elongate member is placed in the first end of the bore. A power source (e.g., a battery) is operatively attached to the light source.

In one characterization, the light source is an incoherent light source, e.g., as contrasted with a coherent light source (e.g., a single phase light source) such as a laser. The light source may be, for example, a halogen lamp or an LED, and in one characterization the light source includes an LED. The LED may be configured to emit light within a wavelength range of at least about 300 nm and not greater than about 1200 nm, such as a wavelength in the range of at least about 700 nm and not greater than about 1000 nm. It is believed that wavelength of greater than about 1200 nm may be difficult to detect using conventional light detection means. In one particular characterization, the LED is configured to emit light primarily in the infrared region, such as at a primary wavelength of at least about 800 nm and not greater than about 900 nm.

In another characterization, the device includes a motor that is operatively connected to the light source and is configured to move the light source as the light source transmits light into the bore, such as by oscillating the light source or rotating the light source about a central axis of the light source.

In another characterization, the device includes a stop element that is configured to maintain a distance between the light source and the end of the structural member when the structural member is placed into the first end of the bore. Such a configuration will prevent an operator from forcing the end of the strength element into direct contact with the light source, reducing the possibility of damage to the light source. The stop element may be configured to maintain a distance between the end of the structural member and the light source of at least about 0.1 mm, such as at least about 1.0 mm, and not greater than about 150 mm, such a not greater than about 100 mm, or event not greater than about 30 mm. For example, the stop element may comprise a shoulder (e.g., a step) disposed within the bore that is configured to prevent movement of the structural member past the shoulder when the member is inserted into the bore. The stop element may also comprise a transparent (e.g., glass) plate that is disposed between the end of the strength element and the light source, where the strength element may be pushed up against the glass plate. In this regard, a transparent gel may be applied, if necessary, between the glass plate and the strength element to facilitate transmission of the light through the plate and into the optical fiber(s). The stop element may also be incorporated into the light source, e.g., where the emitting light surface is disposed behind a transparent plate.

The bore may have a single size (e.g., a permanent diameter), or an adjustable diameter bore may be provided, e.g., by providing insert sleeves to accommodate strength elements of varying diameters.

To provide durability but maintain a relatively light weight, the device body may be fabricated from a metal, such as a lightweight metal. In one characterization, the body is fabricated from aluminum.

In another embodiment, a device that is configured for the detection of light emanating from an end of an optical fiber that is embedded in an elongate structural member is disclosed. The device includes a substantially rigid structural body and a bore disposed at least partially through the structural body. The bore has an aperture at a first end of the bore, the aperture and bore being configured (e.g., sized and shaped) to receive an end of an elongate structural member having at least a first optical fiber embedded along a length of the structural member. A light sensor is disposed within the structural body and proximate a second end of the bore, the light sensor being configured to receive and detect light from the optical fiber when the elongate member is placed in the first end of the bore. A power source may be operatively attached to the light sensor.

In one characterization, the light sensor is selected from a CCD sensor and a CMOS sensor. In another characterization, a light blocking element is disposed at the first end of the bore. The light blocking element is configured to block stray light (e.g., exterior light) from entering the bore and interfering with the ability of the light sensor to detect light from the optical fibers. For example, the light blocking element may be a material, such as an elastomeric material, that is configured to seal around the structural member when the structural member is placed into the bore.

As with the light transmitting device, the light detecting device may include stop element to maintain a distance between the light sensor and the end of the structural member when the structural member is placed into the first end of the bore. The stop element may include, for example, a shoulder (e.g., a step) disposed within the bore that is configured to prevent movement of the structural member past the shoulder. The stop element may be configured to maintain a distance between the end of the structural member and the light sensor of at least about 5 mm, such as at least about 10 mm, and not greater than about 300 mm, such as not greater than about 200 mm or even not greater than about 100 mm.

In one characterization, the device also includes a lens, such as a concave lens, that is configured to focus light emanating from the optical fiber onto the light sensor. In this regard, the foregoing stop element to maintain a distance between the light sensor and the end of the structural member may maintain a proper distance between the end of the structural member and the lens to enhance the efficacy of the lens.

As with the light transmitting device, the body of the light detecting device may be fabricated from a metal, including a lightweight metal such as aluminum.

The following figures illustrate different embodiments in accordance with the present disclosure, and are only intended to illustrate such embodiments and not to otherwise limit the scope of the present disclosure.

Referring to FIGS. 3A to 3F, a cross-sectional view of strength elements according to embodiments of the present disclosure are illustrated. The configuration of the fiber-reinforced sections of the strength elements 326A to 326F is similar to the strength element illustrated in FIG. 2B, and includes an inner core of high tensile strength fibers surrounded by an outer layer of an insulative material, e.g., an inner core comprising carbon fibers surrounded by an outer layer comprising glass fibers. As illustrated in FIG. 3A, the strength element 326A includes four optical fibers 323*a-d* that are concentrically disposed in the strength element 426 around and spaced-apart from the central axis. As illustrated in FIG. 3A, the fibers 323*a-d* are placed at or very near an interface 329A between the inner core 328A and the outer layer 330A. The four optical fibers are also evenly spaced about the central axis, e.g., are radially spaced apart by about 90°. As illustrated in FIG. 3B, optical fibers 323*e-g* are placed very near the outer surface of the strength element 326B, and are radially spaced apart by about 120°. Placement very near the outer surface may be advantageous for early detection of fractures that occur (e.g., are initiated) on the outer surface. However, the optical fibers 323e-g should not be placed so close to the outer surface that they are exposed and subject to damage, e.g., due to direct contact with the outer conductive layer. FIG. 3C illustrates an embodiment of a strength element 326C, wherein four optical fibers 323h-323k are embedded in the inner core 328C. FIG. 3D illustrates an embodiment of a strength element 326D wherein the five optical fibers are placed at the interface 329D between the inner core 328D and the outer layer 330D. The five optical fibers are substantially equidistant from a central axis of the strength element and are substantially equally spaced apart, i.e., radially spaced apart by about 72°. FIG. 3D illustrates that the strength element may include any number of optical fibers, including five or more optical fibers. FIG. 3E illustrates an embodiment of a strength element 326E wherein optical fibers of a first grouping are disposed at a first distance from a central axis of the strength element, and optical fibers of a second group are disposed at a second distance from the central axis, where the second distance is different than the first distance. FIG. 3F illustrates an embodiment of a strength element 326F wherein an optical fiber is disposes along a central axis of the strength element 326F and is surrounded by optical fibers that are spaced apart from the central axis. It will be appreciated that the arrangement of the optical fibers within the strength element illustrated in FIGS. 3A to 3F are merely examples of possible arrangements, and the present disclosure is not limited to these particular arrangements.

Figure 4:
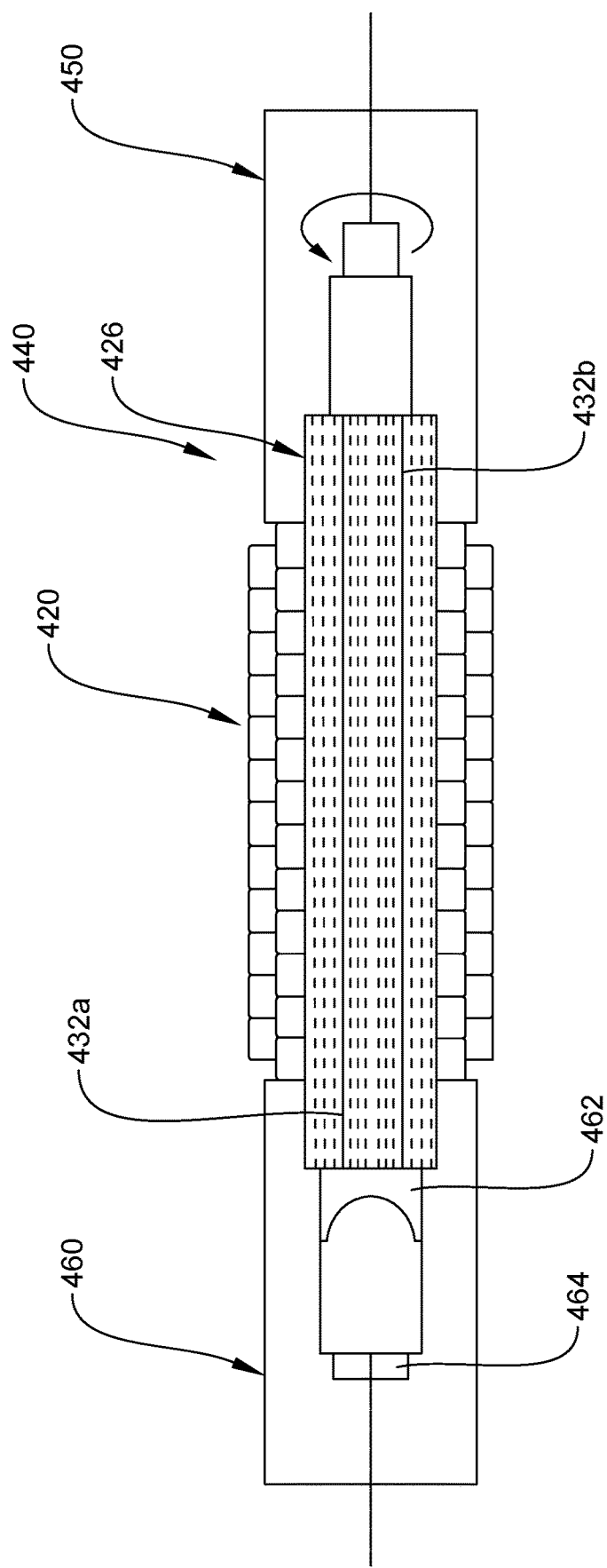
FIG. 4 illustrates a schematic view of a system for the interrogation of a composite strength member according to an embodiment of the present disclosure.

One embodiment of an interrogation system according to the present disclosure is schematically illustrated in FIG. 4. Broadly characterized, the system 440 includes a light transmitting device 450, a light sensing device 460 and a strength element 426, e.g., as is described above.

As illustrated in FIG. 4, the strength element 426 includes four longitudinally-extending optical fibers, of which two optical fibers 432a/432b are visible in FIG. 4. The optical fibers are single mode optical fibers and are placed within the strength element 426, such as offset from the central axis 434, e.g., as is illustrated in FIG. 3A.

Figure 5:
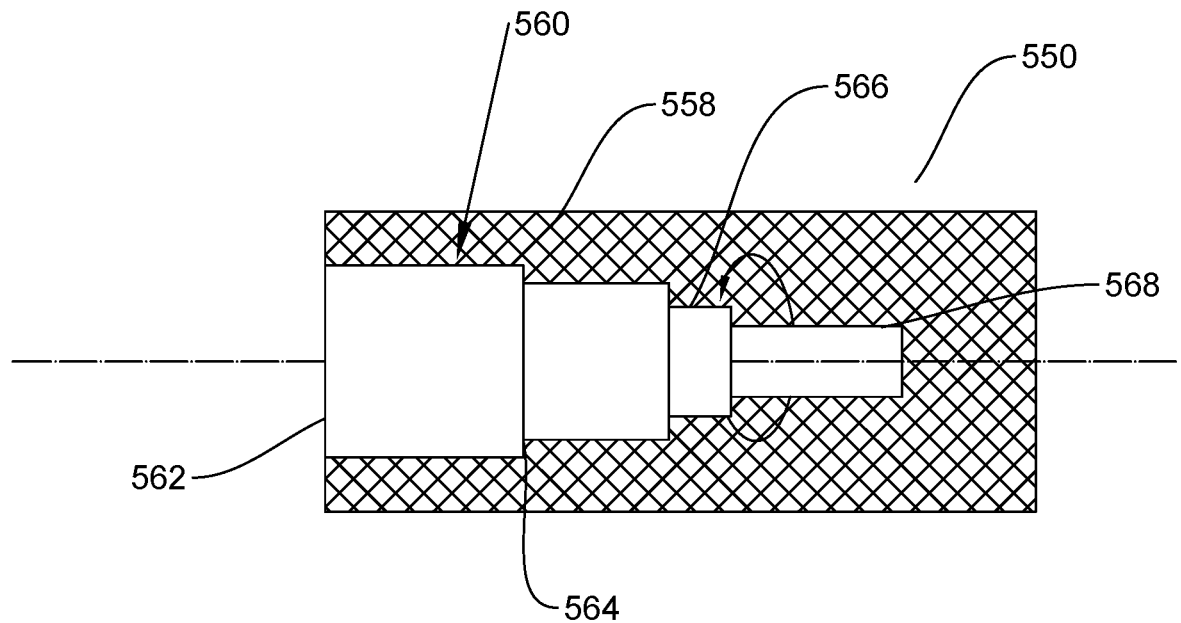
FIG. 5 illustrates a light transmitting device according to an embodiment of the present disclosure.

Referring to FIG. 5, a light transmitting device 550 is illustrated in more detail. The device 550 includes a light transmitter 552 for transmitting the interrogation light. The transmitter 552 includes a light source 566 operatively coupled to a power source 568. The light source 566 is a light emitting diode (LED) having a primary wavelength of about 850 nm. The power source 568 is a battery to facilitate mobility and convenience of use in the field, e.g., during or just after installation of the overhead electrical cable. The LED light source 566 is configured to rotate (e.g., via a motor, not illustrated) so that a sufficient quantity of light from the light source 566 enters each of the optical fiber(s). The components of the light transmitting device 550 are enclosed (e.g., sealed) in a body 558, e.g., fabricated from a metal such as aluminum or a plastic to protect the components from damage during use in the field. The body 558 includes a bore 560 having an aperture at a first end that is configured to receive a strength element into the bore 560. A shoulder 564 is sized to prevent the strength element from penetrating the bore to a point where the strength element comes into contact with the light source 566 (see FIG. 4). Stated another way, the shoulder 564 maintains a predetermined distance between the end of the strength element and the light source 566.

Referring back to FIG. 4, the system also includes a light detecting device 460 disposed at an end of the overhead electrical cable 420 opposite the light transmitting device 450. A light detecting device is illustrated in more detail in FIG. 6. The device 660 includes a light sensor 664 for the detection of light from the light transmitting device. As with the light transmitting device, the components of the light detecting device 660 are enclosed (e.g., sealed) in a body 658, e.g., fabricated from a metal such as aluminum or a plastic to protect the components from damage during use in the field. The body 658 includes a bore 670 having an aperture at a first end that is configured to receive a strength element into the bore 670. Disposed over the aperture leading into the bore 670 is a light shield 676 fabricated from an elastomeric material having an aperture therethrough. When a strength member is inserted into the bore 670, the light shield 676 moves inwardly and forms a light seal around the periphery of the strength element to reduce the amount of stray light that can enter the bore 670 from the external environment.

Figure 6:
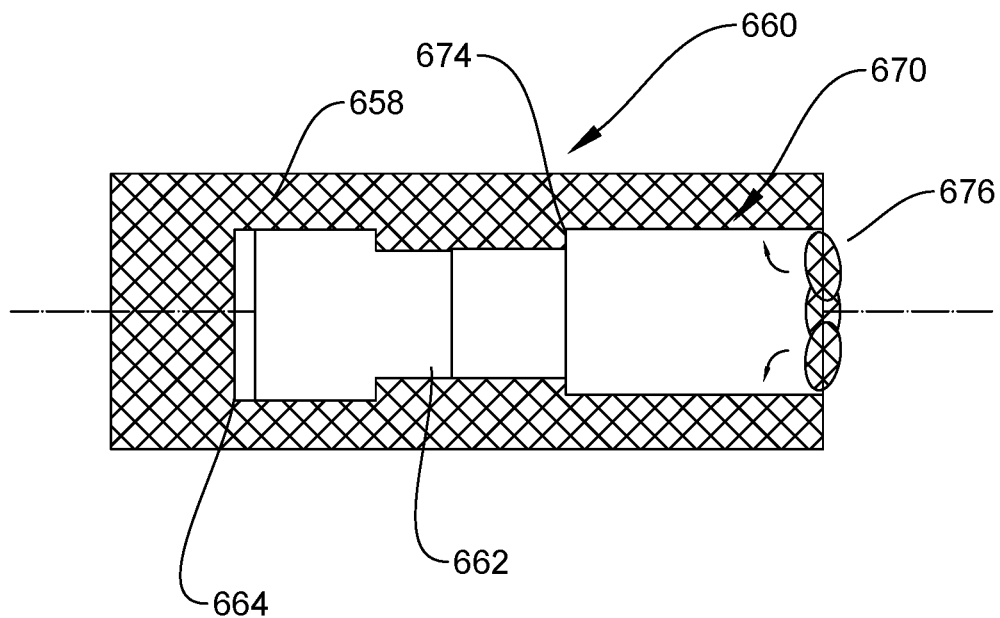
FIG. 6 illustrates a light detecting device according to an embodiment of the present disclosure.

A shoulder 674 is sized to prevent the strength element from penetrating the bore 670 to a point where the strength element comes into contact with the light sensor 664 (see FIG. 4), as the shoulder 674 maintains a predetermined distance between the end of the strength element and the light sensor 664. The light sensor is a CCD/CMOS sensor, e.g. as might be found in a digital camera. As illustrated in FIG. 6, the light detecting device 660 includes a concave lens 662 that directs light received from the light source to the light sensor 664. However, such a concave lens may not be necessary for adequate light detection.

Figure 7A:
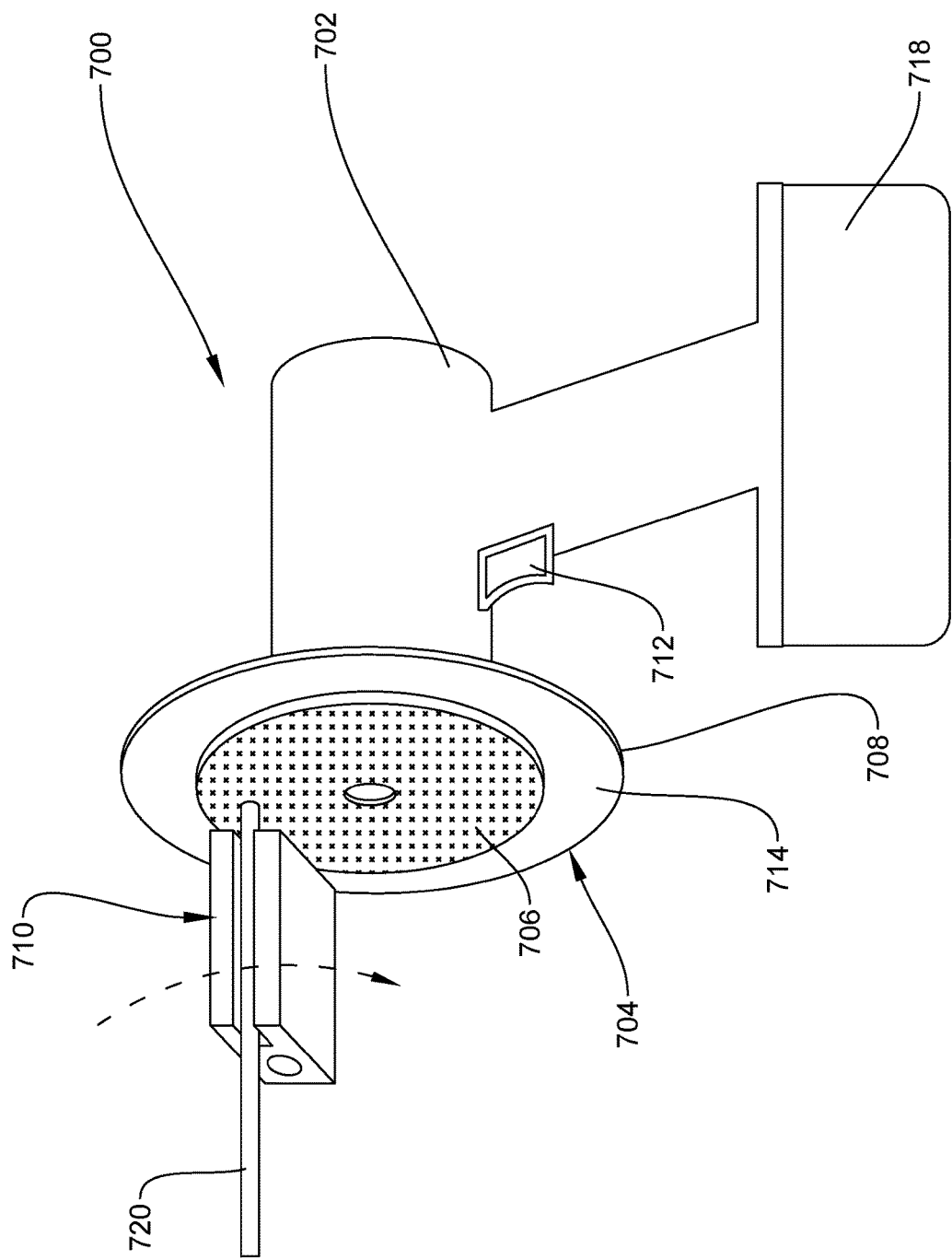
FIGS. 7A and 7B illustrate a cutting and polishing tool according to an embodiment of the present disclosure.
Figure 7B:
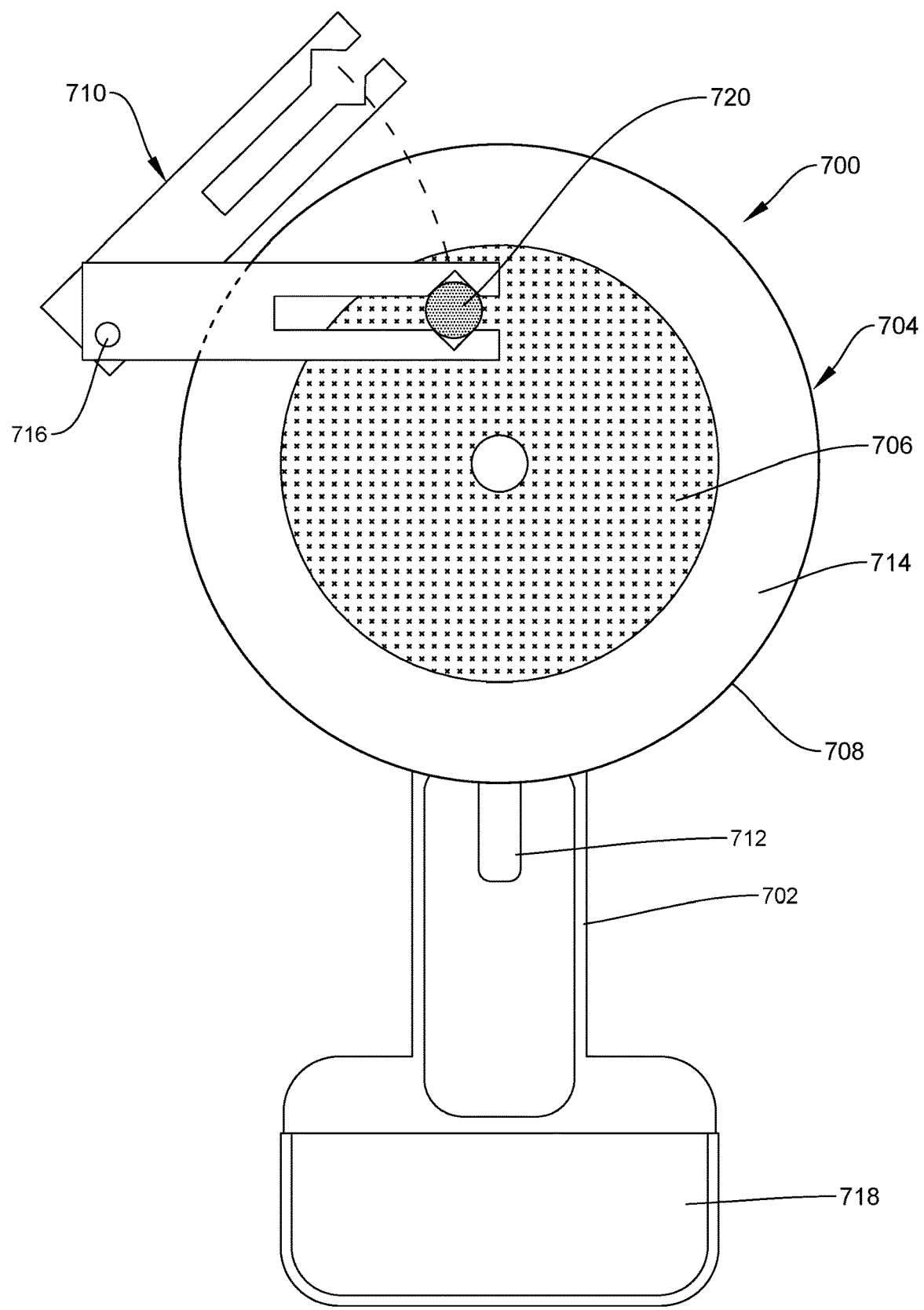

FIGS. 7A and 7B illustrate a tool 700 for the cutting and polishing of a strength element, or similar workpiece, in accordance with an embodiment of the present disclosure. The tool 700 includes a planar and rotatable blade 704 that includes a cutting edge 708 and a polishing surface 706. The polishing surface 706 is raised slightly (e.g., about 1 mm) above the surface 714 of the blade 704. An alignment member 710 is attached to the tool body 702 and is configured to move (e.g., pivot about axis 716) the strength element 720 relative to the cutting blade 704. The alignment member 710 aligns the strength element 720 with the cutting blade 704, such that the cutting edge 708 can cut the strength element 720 substantially orthogonally to the longitudinal axis of the strength element 720. As the cutting edge moves through the strength element, the polishing surface 706 polishes the freshly cut surface of the strength element 720. The tool 700 is configured to be gripped by a user, who may actuate the cutting blade 704 using activation button 712. A rechargeable battery 718 provides power to the tool.

While various embodiments of a system, method and tools for the interrogation of a strength element have been described in detail, it is apparent that modifications and adaptations of those embodiments will occur to those skilled in the art. However, it is to be expressly understood that such modifications and adaptations are within the spirit and scope of the present disclosure.

What is claimed is:

1. A system configured for the detection of a defect in an elongate fiber-reinforced composite strength member, comprising:
   a fiber-reinforced composite strength member, the strength member comprising at least a first strength element, the first strength element comprising:

a binding matrix;

a plurality of reinforcing fibers operatively disposed within the binding matrix to form a fiber-reinforced composite;

at least a first optical fiber embedded within the fiber-reinforced composite and extending from a first end of the fiber-reinforced composite to a second end of the fiber-reinforced composite, the first optical fiber having a first end and a second end; and a light transmitting device operatively connected to a first end of the strength member, the light transmitting device comprising a light source that is operatively connected to a power source and that is configured to transmit light having a wavelength of at least about 300 nm and not greater than about 1700 nm into the first end of the first optical fiber; and a light detecting device operatively connected to a second end of the strength member, the light detecting device comprising a light detector that is configured to detect the light emitted by the light source through the second end of the first optical fiber.

2. The system recited in claim 1, wherein the light source is configured to emit light having a primary wavelength in the infrared region.

3. The system recited in claim 1, wherein the light source is configured to emit light having a primary wavelength of at least about 800 nm.

4. The system recited in claim 1, wherein the light source is configured to emit light having a primary wavelength of not greater than about 1000 nm.

5. The system recited in claim 1, wherein the strength element includes at least a second optical fiber embedded within the fiber-reinforced composite and extending from the first end of the fiber-reinforced composite to the second end of the fiber-reinforced composite, the second optical fiber having a first end and a second end.

6. The system recited in claim 5, wherein the strength element includes at least a third optical fiber embedded within the fiber-reinforced composite and extending from the first end of the fiber-reinforced composite to the second end of the fiber-reinforced composite, the third optical fiber having a first end and a second end.

7. The system recited in claim 6, wherein the strength element includes at least a fourth optical fiber embedded within fiber-reinforced composite and extending from the first end of the fiber-reinforced composite to the second end of the fiber-reinforced composite, the fourth optical fiber having a first end and a second end.

8. The system recited in claim 1, wherein an electrical conductor is disposed around and supported by the strength member to form an electrical cable.

9. The system recited in claim 8, wherein the electrical cable has a length of at least about 100 meters.

10. The system recited in claim 8, wherein the electrical cable has a length of not greater than about 3500 meters.

11. The system recited in claim 1, wherein the first optical fiber is a single mode optical fiber.

12. The system recited in claim 1, wherein the light source comprises a light-emitting diode (LED).

13. The system recited in claim 1, wherein the light detecting device comprises a concave lens that is disposed between the end of the composite strength member and the light sensor and is configured to focus the transmitted light onto the light sensor.

14. The system recited in claim 1, wherein the light sensor is selected from a CCD sensor and a CMOS sensor.

15. The system recited in claim 1, further comprising an index-matching material disposed on at least the first end of the fiber-reinforced composite.

16. The system recited in claim 15, wherein the index-matching material has a refractive index of at least about 1.40 and not greater than about 1.50.

17. The system recited in claim 1, wherein the light source is an incoherent light source.

18. The system recited in claim 1, wherein the first optical fiber does not extend beyond the first end of the fiber-reinforced composite.

19. The system recited in claim 18, wherein the first optical fiber does not extend beyond the second end of the fiber-reinforced composite.

20. The system recited in claim 19, wherein the first and second ends of the strength element each comprise a smooth planar surface.

21. The system recited in claim 5, wherein the second optical fiber does not extend beyond the first end of the fiber-reinforced composite and does not extend beyond the second end of the fiber-reinforced composite.

22. A system configured for the detection of a defect in an elongate fiber-reinforced composite strength member, comprising:

a fiber-reinforced composite strength member, the strength member comprising at least a first strength element, the first strength element comprising:

a binding matrix;

a plurality of reinforcing fibers operatively disposed within the binding matrix to form a fiber-reinforced composite;

at least a first optical fiber embedded within the fiber-reinforced composite and extending from a first end of the fiber-reinforced composite to a second end of the fiber-reinforced composite, the first end and the second end each comprising a smooth and planar surface, the first optical fiber having a first end and a second end, wherein the first end of the optical fiber does not extend beyond the first end of the fiber-reinforced composite and the second end of the optical fiber does not extend beyond the second end of the fiber-reinforced composite; and a light transmitting device operatively connected to a first end of the strength member, the light transmitting device comprising a light-emitting diode that is operatively connected to a power source and that is configured to transmit incoherent light having a wavelength of at least about 300 nm and not greater than about 1700 nm into the first end of the first optical fiber; and a light detecting device operatively connected to a second end of the strength member, the light detecting device comprising a light detector that is configured to detect the light emitted by the light-emitting diode through the second end of the first optical fiber.

* * * * *